United States Patent [19]
Iwakiri et al.

[11] Patent Number: 5,629,225
[45] Date of Patent: May 13, 1997

[54] METHOD OF MAKING A CYLINDRICAL ELECTRODE

[75] Inventors: Takashi Iwakiri, Ono; Kiyomi Hirose, Tsukuba; Hiroto Shinozuka, Omigawamachi; Osaomi Enomoto; Yasuhiro Okumoto, both of Ibaraki, all of Japan

[73] Assignee: Texas Instruments Incorporated, Dallas, Tex.

[21] Appl. No.: 478,635

[22] Filed: Jun. 7, 1995

[30] Foreign Application Priority Data

Jun. 30, 1994 [JP] Japan .................. 6-201271

[51] Int. Cl.$^6$ .............. H01L 21/70; H01L 27/00
[52] U.S. Cl. ............... 438/397; 438/739
[58] Field of Search ............... 437/919, 52, 60

[56] References Cited

U.S. PATENT DOCUMENTS

| | | | |
|---|---|---|---|
| 5,164,337 | 11/1992 | Ogawa et al. | 437/919 |
| 5,436,187 | 7/1995 | Tanigawa | 437/52 |

*Primary Examiner*—Jey Tsai
*Attorney, Agent, or Firm*—William B. Kempler; Richard L. Donaldson

[57] ABSTRACT

A manufacturing method for a dynamic RAM containing a screen-type structure cylindrical stack cell capacitor. An $SiO_2$ layer 22 is formed on a polysilicon layer 11 (or a semiconductor substrate 1) to serve as a preform or spacer. A nitride layer 31 is stacked on this $SiO_2$ layer, and nitride layer 31 and $SiO_2$ layer 22 are worked into virtually the same pattern. Then the outside surface of $SiO_2$ layer 22 is etched using nitride layer 31 as a mask, causing the nitride layer 31 to form a lateral projection structure 31A in the region removed by the etching. A polysilicon layer 23 is adhered to the top of silicon layer 11, which serves as a capacitor lower electrode, from the top of nitride layer 31 and $SiO_2$ layer 22, including this projected portion. Polysilicon layer 23 is etched to leave a portion of polysilicon layer 23 on the outside surface of $SiO_2$ layer 22 directly beneath the projecting portion 31A of nitride layer 31.

4 Claims, 20 Drawing Sheets

METHOD OF MAKING A CYLINDRICAL ELECTRODE

FIELD OF THE INVENTION

The present invention relates to a manufacturing method for a semiconductor device, and more particularly to a dynamic RAM having, for example, cylindrical stack cell capacitors.

BACKGROUND OF THE INVENTION

Conventionally, screen-type structure elements—for example semiconductor integrated circuit devices such as dynamic RAM with cylindrically formed stack cell capacitors for increasing capacitance—were manufactured by passing through processes such as those shown in FIGS. 43 through 50.

To fabricate the layered structure in FIG. 43, a field $SiO_2$ film 2 is selectively formed on the main side of a P-type silicon substrate 1 by the known LOCOS method, after which a gate oxide film 5 is formed by a thermal oxidation method. Then the polysilicon in the first layer is stacked by the CVD method (chemical vapor growing method); this is patterned by a photo-etching method to form a polysilicon word line WL. Then N-type impurities (for example arsenic or phosphorous) are implanted in the silicon substrate by an ion-implantation method using word line WL as a mask. Then $N^+$ semiconductor regions 3 (source region) and 4 (drain region) are formed by the self-alignment method. For insulation, an oxide film 6 is formed in virtually the same pattern on word line WL.

Using the CVD method, an $SiO_2$ passivation layer 7 is deposited over the entire surface, an $Si_3N_4$ layer 8 and an $SiO_2$ layer 9 for protecting the base layer are successively stacked, and a portion of the stacked film on the $N^+$ source region 3 is selectively removed by over-cutting using dry etching to form a contact hole 10.

Next, a second layer polysilicon layer 11 is deposited by the CVD method over the entire surface, which includes contact hole 10, to connect with the source region 3, and an $SiO_2$ layer 12 preform or spacer, which forms a screen-type structure, is deposited on this polysilicon layer 11 by the CVD method.

Next, as shown in FIG. 44, photo-resist 13 is adhered in a prescribed pattern, and patterning is performed using this [photo-resist] as a mask by etching the bottom $SiO_2$ layer 12.

Next, as shown in FIG. 45, after the removal of photo-resist 13 a third polysilicon layer 13 is deposited over the entire surface of $SiO_2$ layer 12 and polysilicon layer 11 by the CVD method. This polysilicon layer 13 becomes the screen material.

Next, as shown in FIG. 46, the entire surface of polysilicon layer 13 is etched by dry etching, and polysilicon layer 13 is selectively left by etching back as a side wall on only the outer surface (outer circumference) of $SiO_2$ layer 12. This polysilicon layer 13 is left in a cylindrical form, and becomes one of the electrodes of the cell capacitor. However, there is quite a large level differential 14 at the time of this etch back due to the word line WL and the stacked films 6, 7, 8, and 9 over it, so that an unetched polysilicon residue 13a remains at the bottom of this level differential.

Next, as shown in FIG. 47, the $SiO_2$ layer 12 which serves as a preform (spacer) and the stacking film $SiO_2$ layer 9 are selectively removed by etching, exposing polysilicon layer 13 as a cylinder while forming a fin portion 11A in polysilicon layer 11. However, because the polysilicon residue 13a is not etched, a portion 9a of $SiO_2$ layer 9 remains at the bottom thereof.

Next, as shown in FIG. 48, a dielectric film, for example $Si_3N_4$ layer 15, is deposited over the entire surface by the CVD method, and pinholes are filled with an oxide film by oxidizing the $Si_3N_4$ layer, making the dielectric film into a fine film.

Next, as shown in FIG. 49, a fourth layer $SiO_2$ layer 16 is deposited over the entire surface by the CVD method. This becomes the upper electrode (plate electrode) of the cell capacitor Cap.

Although not illustrated, an inter-layer insulating film is stacked on this upper electrode 16 by the CVD method, and a contact hole which reaches the $N^+$ drain region 4 is opened therein. A bit line is adhered to this contact hole to manufacture, for example, a memory cell for a 64 megabit dynamic RAM.

By application of "sidewall" technology in this manner, a memory cell having a screen-type structure cylindrical stack cell capacitor Cap can be manufactured, but the present inventors have discovered the following deficiencies upon investigation of this manufacturing method.

That is to say, in the whole-surface etching of polysilicon layer 13 in particular in FIGS. 45 and 46, there is no problem when the base is flat, but as was illustrated, there is a fairly large level differential 14 on the side of word line WL, such that the unetched polysilicon residue 13a remains at the bottom of [that] level differential 14.

This residue 13a, as shown by the diagonal lines in FIG. 50, exists between adjacent capacitors Cap-Cap along word line WL, connecting these capacitors (specifically, between the polysilicon layers 13—13 in the stage shown in FIG. 46). This type of residue 13a also exists similarly in regions outside of what is illustrated.

As a result, capacitor-to-capacitor shorting occurs between each memory cell, causing difficulties such as flawed operation of the memory function, etc., and preventing normal operation.

In circumvention of such problems, polysilicon residue 13a can be completely removed by sufficiently etching the entire surface of polysilicon layer 13 as shown in FIG. 51. In that case, however, there is further etching of the polysilicon layer 13 which one wishes to leave as the lower electrode of the capacitor, and the height thereof is notably reduced.

Since in this case capacitor electrode surface area (in other words, capacitance) is greatly reduced, [such a method] is inappropriate. Furthermore, there are some cases in which, when level differential 14 is even higher, the attempt to remove polysilicon residue 13a will cause the polysilicon layer 13 itself to be excessively etched and disappear.

Therefore, an object of the present invention is to provide a method for manufacturing a semiconductor device in which a screen-type structure can be formed controllably and reliably even when the base is not flat.

SUMMARY OF INVENTION

The present invention relates to a manufacturing method for a semiconductor device having a process for forming a first layer (for example, the $SiO_2$ layer 22 which serves as a preform or spacer described below) on a substrate, a process for stacking a second layer (for example, the nitride layer 31 described below) on the first layer, a process for processing the second layer and the first layer into virtually the same pattern, a process in which, by etching the outside surface of the first layer using the second layer as a mask after this processing, the second layer is caused to project (that is, to form a lateral projection structure) on the region removed by this etching, a level differential in which a third layer (for example the polysilicon layer 23 which serves as the capacitor lower electrode as described below) is adhered from the second layer and the first layer, including this projected portion, to the substrate, and a process in which the third layer is etched such that a portion of the third layer remains on the outside surface of the first layer directly beneath the projecting portion.

The manufacturing method of the present invention can be implemented even when a level differential such as the previously described level differential 14 exists at the base of the third layer at its base during etching. That is, after adhering the third layer, including the level differential portion on the substrate, the entire surface of this third layer can be etched.

It is desirable, after adhering the third layer, to stack a fourth layer (for example, the SiO$_2$ layer 32 described below), to etch the entire surface of this fourth layer, leaving a portion of the fourth layer on the outside surface of the third layer directly beneath the adhered portion of the third layer in the projecting portion of the second layer, and, further, to etch the third layer using a portion of this fourth layer as a mask.

After etching the third layer, a screen-type structure capacitor in which the third layer and the sixth layer serve as opposing electrodes, and the fifth layer serves as a dielectric film may be formed by removing at least the second layer and the first layer respectively by etching, by adhering a fifth layer (for example, the nitride layer 25 described below) onto the surface which includes remaining the third layer and, further, by adhering a sixth layer (for example, the polysilicon layer 26 which serves as the capacitor upper electrode as described below) to this fifth layer.

Also in the figures, 1 is a silicon substrate, 3 is a N$^+$ source region, 4 is a N$^+$ drain region, 6, 7, 9, 12, 22, 32, 44, 45, 46, 62 are SiO$_2$ layers, 8, 31 are Si$_3$N$_4$ layers, 11, 13, 16, 23, 26, 50 are polysilicon layers, 11A is a fin portion, 13a is a polysilicon residue, 14 is a level differential, 15, 25 is a dielectric film, 21 is an etching by-product, 26 is a polysilicon layer (upper electrode), 31A is a lateral projection, 49 is a contact hole, WL is a word line, BL is a bit line, and Cap, CAP are a cell capacitors.

DETAILED DESCRIPTION

FIGS. 1–25 show a first embodiment, in which the present invention is applied to a dynamic RAM.

Figure 1:
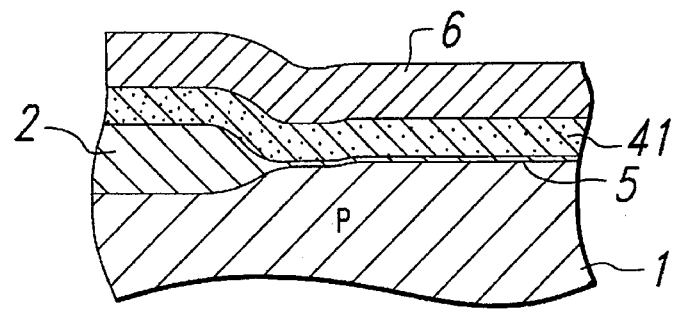
FIG. 1 is a cross section of the key portion of one stage of a manufacturing process for a dynamic RAM memory cell in accordance with a first embodiment of the present invention.

In order to manufacture a dynamic RAM (in particular, the memory cells thereof) in accordance with the present embodiment, a field $SiO_2$ film 2 is selectively formed to a thickness of 4000 Å on a primary surface of P-type silicon substrate 1 by the known LOCOS method (oxidation temperature: 1100° C.) as shown in FIG. 1, following which a gate oxide film 5 is formed in a thickness of 120 Å by the thermal oxidation method (temperature 850° C.).

Figure 2:
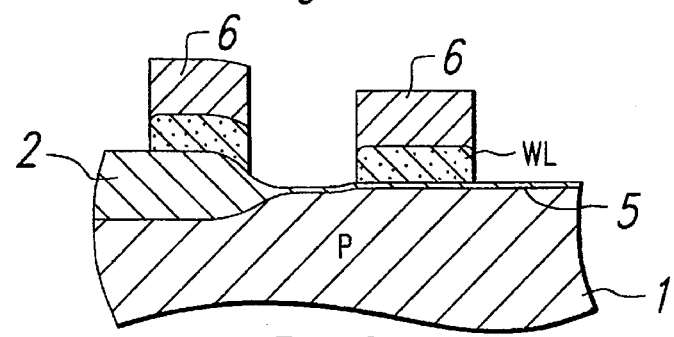
FIG. 2 is a cross section of another stage of the same.

Next, the first layer phosphorous-doped polysilicon layer 41 is deposited to a thickness of 1500 Å by the CVD method. After stacking $SiO_2$ layer 6 to a thickness of 2000 Å over this [layer 41] by the CVD method (temperature 800° C.), this stacking film is patterned by the photo-etching method as shown in FIG. 2, and the polysilicon word line WL and $SiO_2$ layer 6 are formed into the same pattern.

Figure 3:
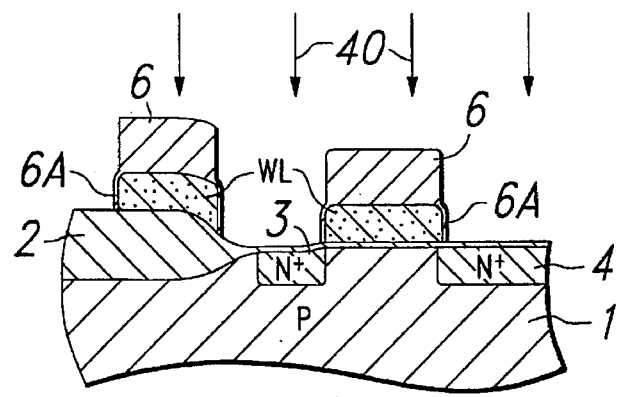
FIG. 3 is a cross section of another stage of the same.

Next, as shown in FIG. 3, a thin $SiO_2$ film 6A having a thickness of 120 Å is formed by thermal oxidation on the outside surface of word line WL, and N-type impurities (for example arsenic or phosphorous) 40 are implanted into the silicon substrate by the ion implantation method at 40 keV, $2\times10^{13}/cm^3$, using $SiO_2$ layer 6 and word line WL as a mask, forming $N^+$ semiconductor regions 3 (source region) and 4 (drain region) by the self-aligning method.

Figure 4:
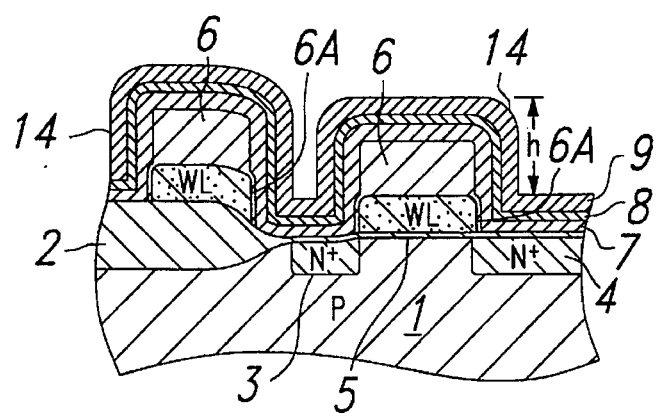
FIG. 4 is a cross section of another stage of the same.

Next, as shown in FIG. 4, a 450 Å-thick $SiO_2$ layer 7 for passivation, a 300 Å-thick $Si_3N_4$ layer 8 which protects the base layer, and a 700 Å-thick $SiO_2$ layer 9 which forms the capacitor fin section are successively stacked. A relatively large level differential 14 having a height of about 3500 Å is formed on the side of word line WL.

Figure 5:
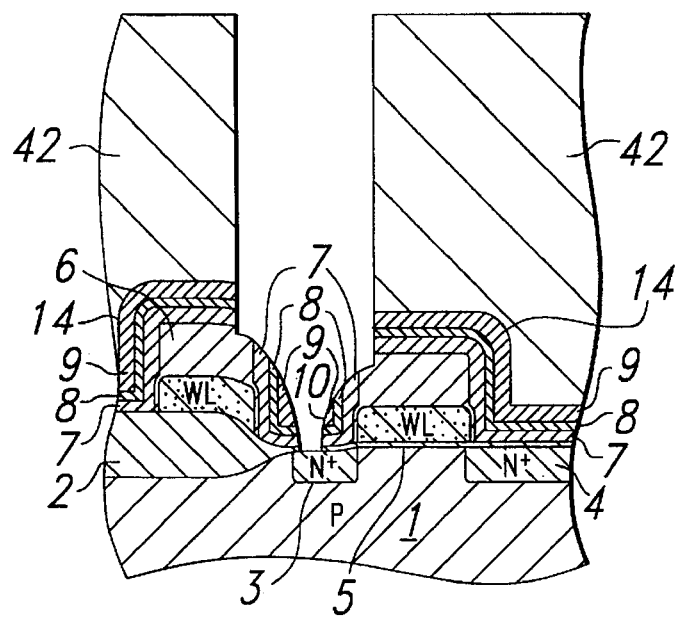
FIG. 5 is a cross section of another stage of the same.

Next, as shown in FIG. 5, photo-resist 42 is formed into a prescribed pattern on the surface of silicon substrate 1, and $SiO_2$ layer 9, $Si_3N_4$ layer 8 and $SiO_2$ layer 7 are successively dry etched using this [photo-resist pattern] as a mask, and a portion of the stacked film on source region 3 is removed to form contact hole 10.

Figure 6:
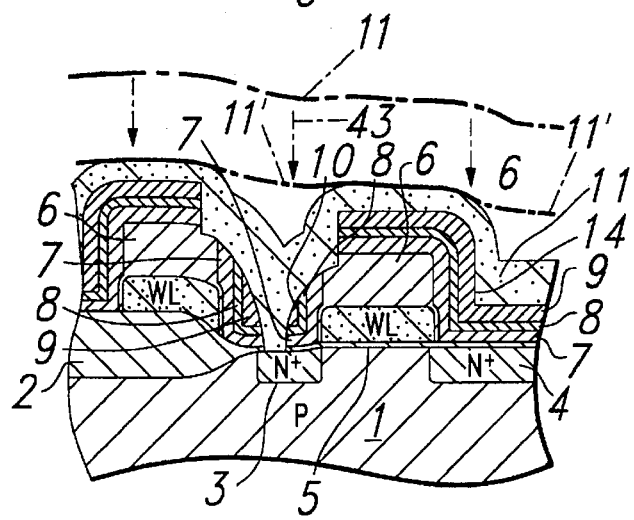
FIG. 6 is a cross section of another stage of the same.

Next, as shown in FIG. 6, a second layer phosphorous-doped layer 11 is deposited by the CVD method to a thickness of 1500 Å such that it includes contact hole 10 and also contacts source region 3. This polysilicon layer 11 can, after deposition to a thickness of 5000 Å as shown by the imaginary line, be etched back as shown by arrow 43 and formed in the manner shown by imaginary line 11', but given the preferability of depositing a thin film (for example 1500 Å) and reflecting the shape of the base with the object of increasing surface area, it is better to deposit from the start up to the thickness shown by the solid line.

Figure 7:
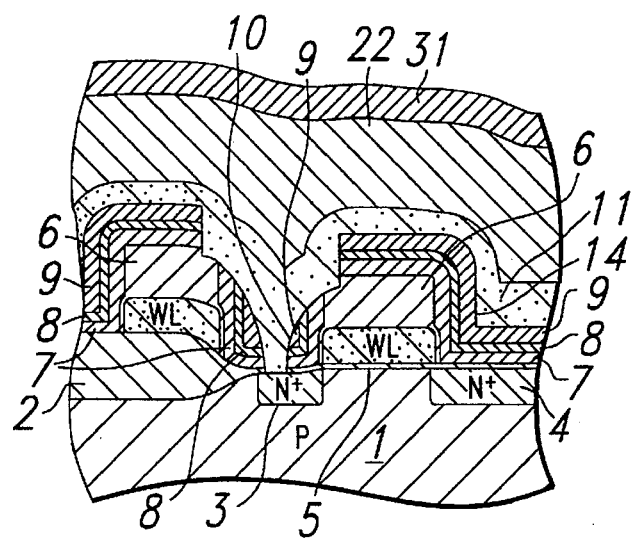
FIG. 7 is a cross section of another stage of the same.

Next, as shown in FIG. 7, the $SiO_2$ layer 22 preform or spacer which forms the screen-type structure is deposited to a thickness of 3500 Å on the polysilicon layer 11 by the CVD method (temperature 800° C.). A $Si_3N_4$ layer 31 is then deposited thereon to a thickness of 1300 Å by the CVD method (temperature 800° C.).

Figure 8:
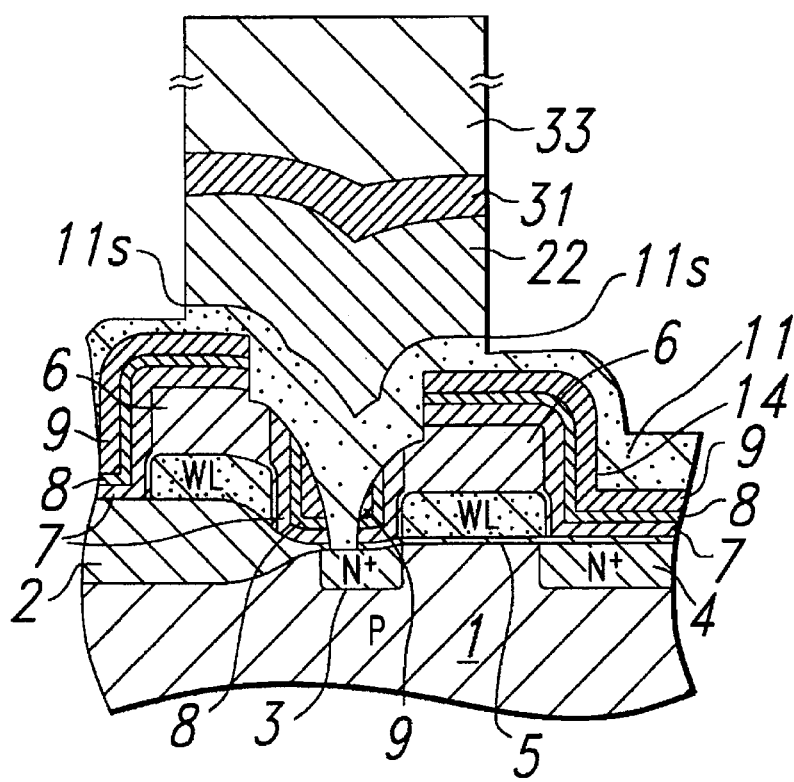
FIG. 8 is a cross section of another stage of the same.

Next, as shown in FIG. 8, photo-resist 33 is adhered in a prescribed pattern, and bottom layers $Si_3N_4$ layer 31 and $SiO_2$ layer 22 are etched to the same pattern using this as a mask. In this case, polysilicon layer 11 is also etched to some degree.

Figure 9:
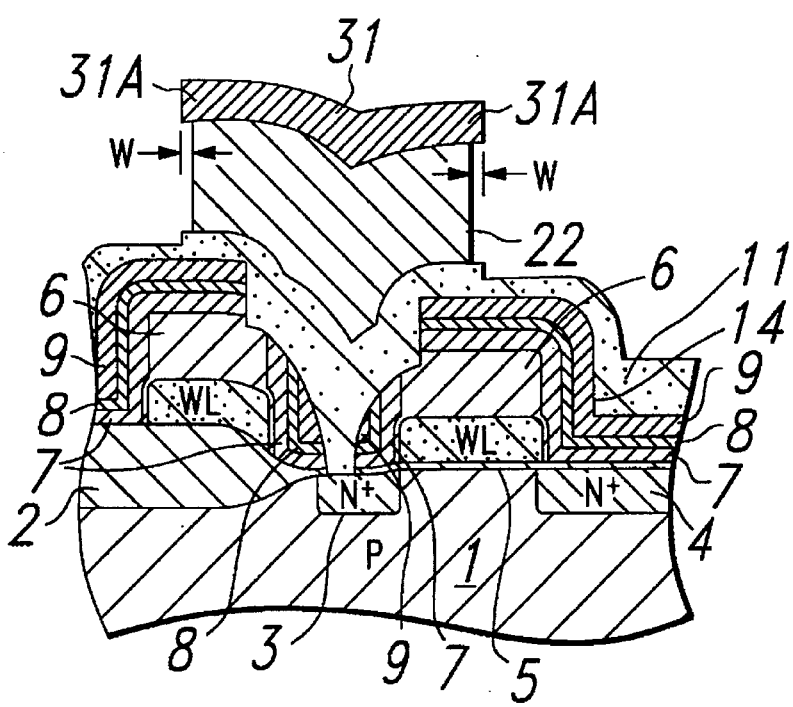
FIG. 9 is a cross section of another stage of the same.

Next, as shown in FIG. 9, after the removal of photo-resist 33, base $SiO_2$ layer 22 is etched (the $SiO_3$ layer 22 layer side surface is undercut) using $Si_3N_4$ layer 31 as a mask, and a lateral projection 31A having a width w=700 Å is formed in $Si_3N_4$ layer 31. That is, the circumference of $SiO_2$ layer 22 is undercut 700 Å. This etching is performed using fluoric acid, washing the surface of polysilicon layer 11 at the same time that $SiO_2$ layer 22 is undercut.

Figure 10:
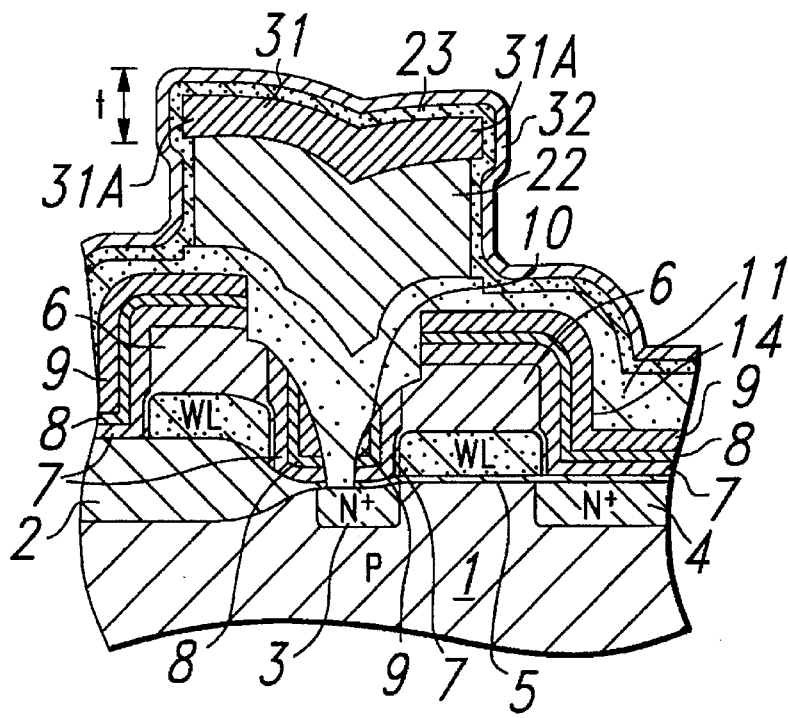
FIG. 10 is a cross section of another stage of the same.

Next, as shown in FIG. 10, a third layer phosphorous-doped polysilicon layer 23 is deposited to a thickness of 700 Å on the entire surface of $Si_3N_4$ layer 31, $SiO_2$ layer 22, and polysilicon layer 11 by the CVD method. This polysilicon layer 23 is what becomes the screen material; it is also adhered around lateral projection 31A of $Si_3N_4$ layer 31.

A $SiO_2$ layer 32 is further deposited on polysilicon layer 23 as a protective film to a thickness of 450 Å by the CVD method (temperature 800° C.). In this case, the total thickness t of $Si_3N_4$ layer 31 and the layers 32 and 23 adhered to this lateral projection 31A is about 3300 Å. Polysilicon layer 23 is amorphous silicon at the time of deposition and is heated to become polysilicon.

Figure 11:
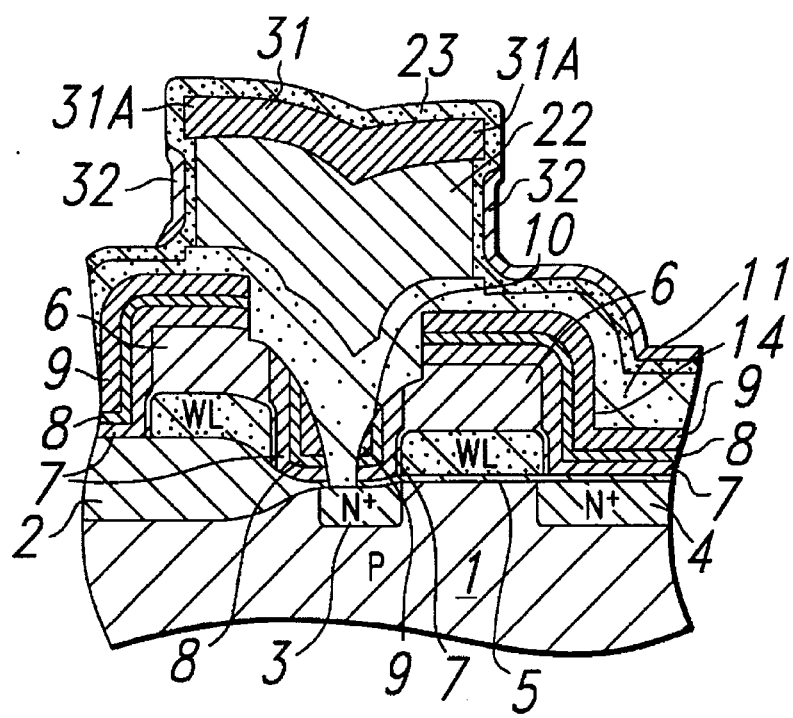
FIG. 11 is a cross section of another stage of the same.

Next, as shown in FIG. 11, the entire surface of $SiO_2$ layer 32 is etched, and a portion of $SiO_2$ layer 32 is selectively left as a side wall on only the side surface of polysilicon layer 23 directly beneath the lateral projection 31A of $Si_3N_4$ layer 31. At this time, $SiO_2$ layer 32 is removed across the thickness t shown in FIG. 10, not only on $Si_3N_4$ layer 31 but also around this lateral projection 31A, while at the same time approximately 200 Å of polysilicon layer 23 on $Si_3N_4$ layer 31 is removed by etching to leave a thickness of 500 Å.

Figure 12:
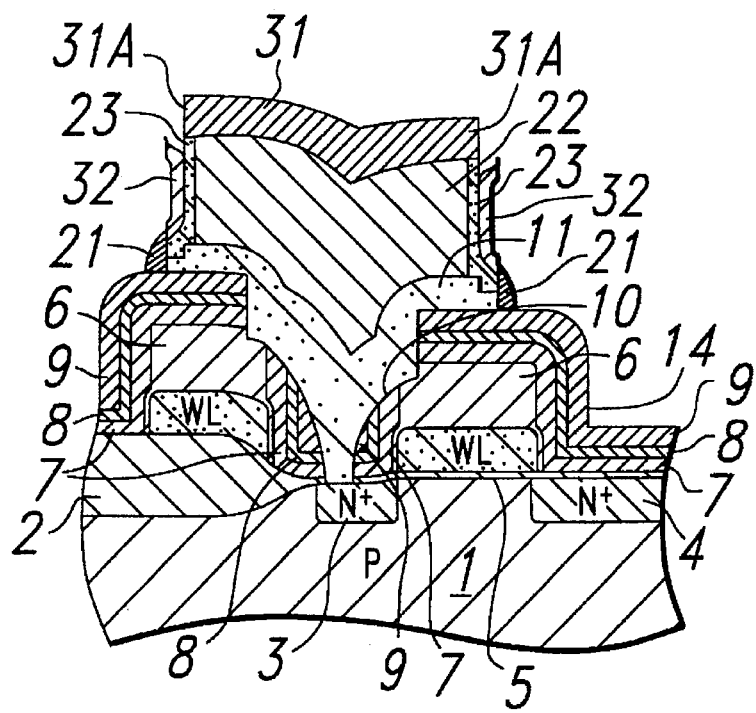
FIG. 12 is a cross section of another stage of the same.

Next, as shown in FIG. 12, the entire surface of 23 is etched by dry etching, and polysilicon layer 23 is selectively left as a side wall on only the outer surface (circumference) of $SiO_2$ layer 22. In this case, the polysilicon layer 23 directly beneath is protected from etching by lateral projection 31A of $Si_3N_4$ layer 31, and $SiO_2$ layer 32, as a side wall, protects the outside of polysilicon layer 23 on the outside surface of $SiO_2$ layer 22. This makes it possible to selectively leave just the thickness (or height) underneath lateral projection 31A of polysilicon layer 23 on the side surface of $SiO_2$ layer 22.

At the time of this etching, therefore, the polysilicon layer 23 which is to be left on the outside surface of $SiO_2$ layer 22 is protected by $Si_3N_4$ layer 31 lateral projection 31A, while its outer surface is protected and controlled by $SiO_2$ layer 32, so that not only can polysilicon layer 23 be selectively left under lateral projection 31A by sufficient etching of the polysilicon layer [starting] from the state shown in FIG. 11, but also it is possible to completely remove the unnecessary portion thereof, and the outer surface of the remaining polysilicon layer 23 will be smooth.

Figure 40:
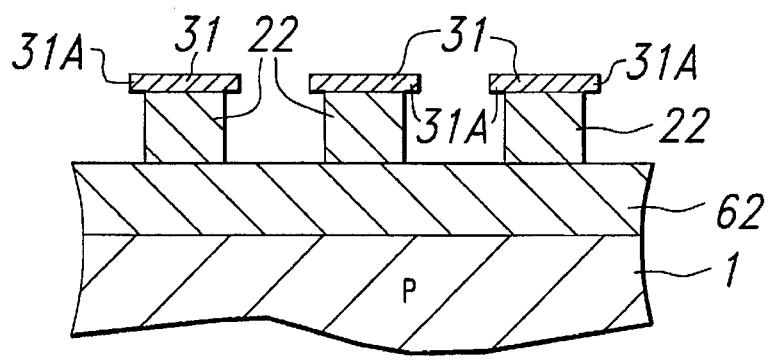
FIG. 40 is a cross section of another stage of the same.

In other words, it is possible to sufficiently remove the polysilicon layer 23 on $Si_3N_4$ layer 31 and the polysilicon layers 23 and 11 in the region outside of $Si_3N_4$ layer 31 and $SiO_2$ layers 22 and 32, while at the same time it is possible to completely remove [this material] from the level differential 14, so that there will be no occurrence at level differential 14 of the type of polysilicon residue described as residue 13a in FIG. 40, and there will be no destruction of the outside surface of the remaining polysilicon layer 23 from etching.

However, because etching of the polysilicon layer is performed sufficiently due to the existence of the $Si_3N_4$ layer 31 lateral projection 31A, there is a tendency for deposits (etching by-products) 21, which are polymerized by polysilicon etching, to adhere to the periphery of polysilicon layers 23 and 11 as shown in FIG. 12. As is described below, these deposits 21 have an advantageous effect particularly on the etching of polysilicon layer 11 and, further, on mask alignment when forming $SiO_2$ layer 22; illustration thereof is omitted after FIG. 13.

Figure 13:
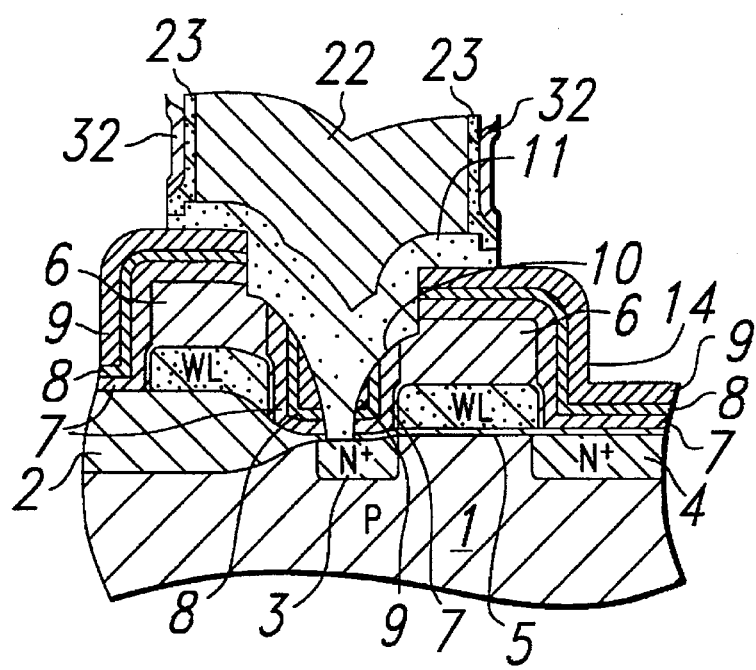
FIG. 13 is a cross section of another stage of the same.

Next, as shown in FIG. 13, $Si_3N_4$ layer 31 is removed by etching with hot phosphoric acid, exposing $SiO_2$ layer 22 as a spacer. In this case, it is necessary to use a sufficiently fast etching rate for $Si_3N_4$ layer 31 with respect to polysilicon layers 23 and 11.

Figure 14:
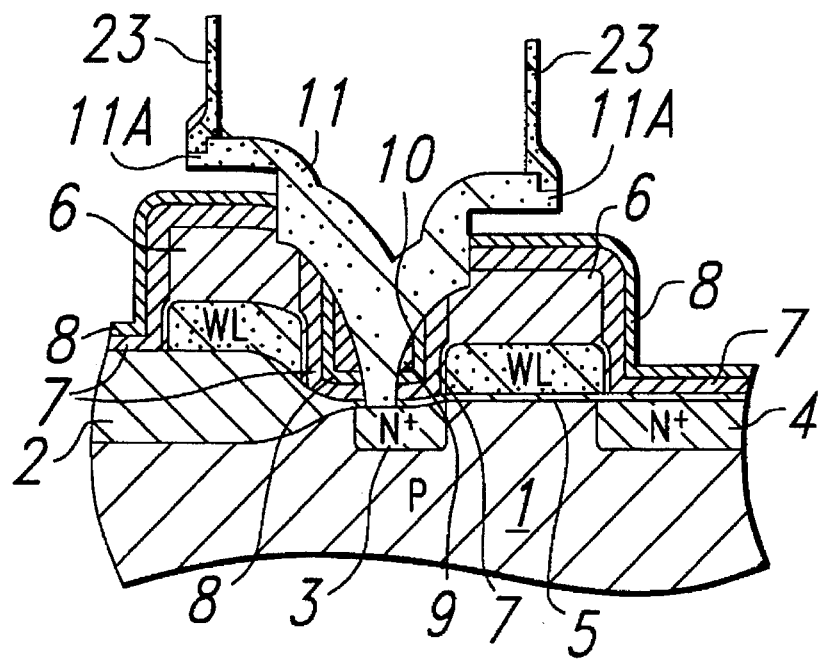
FIG. 14 is a cross section of another stage of the same.

Next, as shown in FIG. 14, $SiO_2$ layers 22, 32, and 9 are removed by etching with fluoric acid and polysilicon layer 23 is exposed as a cylinder forming one of the capacitor electrodes, while fin portion 11A is formed on polysilicon layer 11. In this case, it is necessary to use a sufficiently fast etching rate for $SiO_2$ layers 22, 32, and 9 with respect to polysilicon layers 23 and 11.

Figure 15:
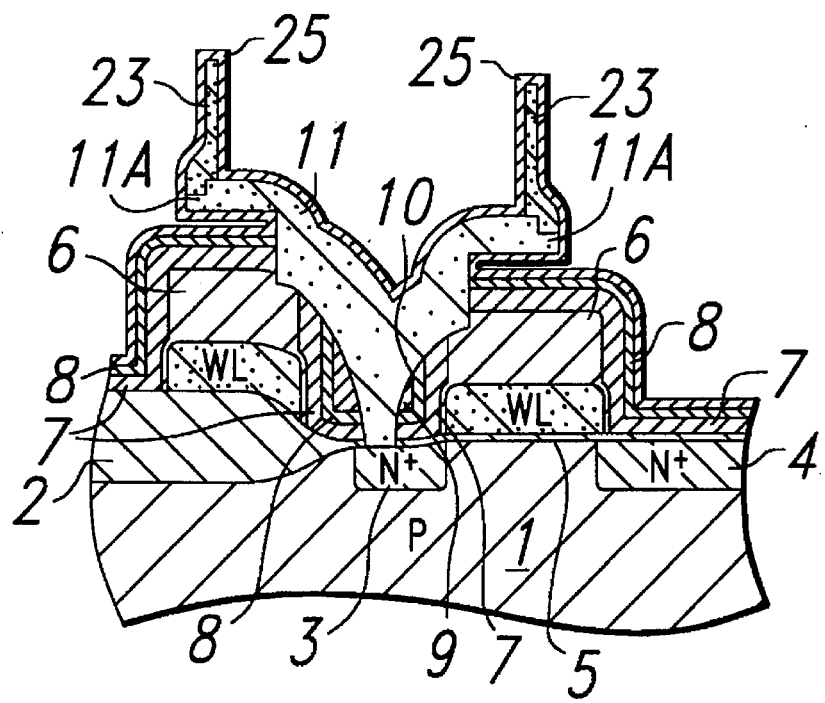
FIG. 15 cross section of another stage of the same.

Next, as shown in FIG. 15, a dielectric film, for example $Si_3N_4$ film 25, is deposited to a thickness of 75 Å on the entire surface by the CVD method (temperature 700° C.), and pinholes are filled with an oxide film by oxidizing the $Si_3N_4$ layer at a temperature of 850° C., making the dielectric film into a fine film.

Figure 16:
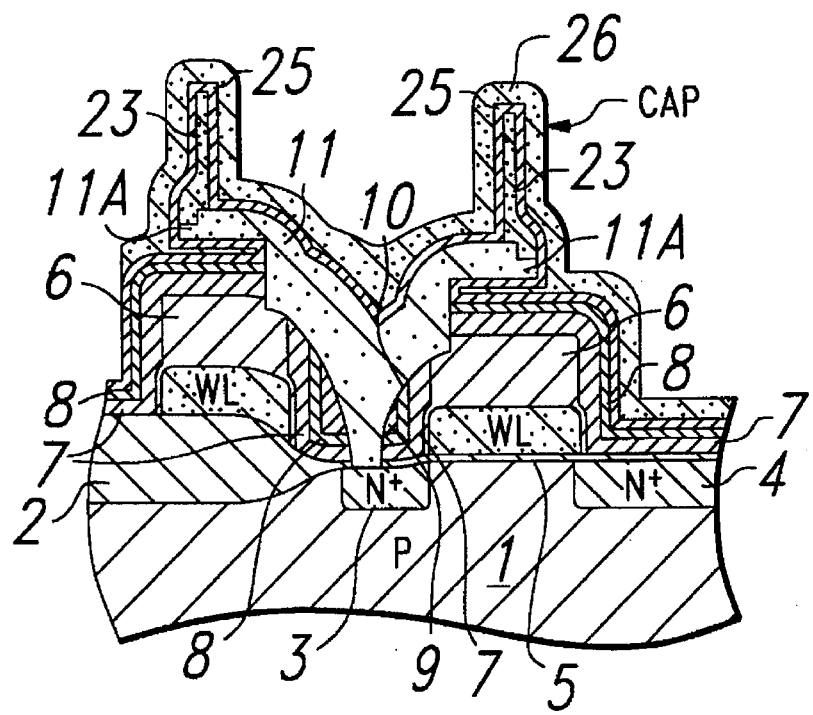
FIG. 16 is a cross section of another stage of the same (the section through line XVI—XVI in FIG. 24).

Next, as shown in FIG. 16, a fourth layer phosphorous-doped polysilicon layer 26 is deposited to a thickness of 700 Å over the entire surface by the CVD method; this becomes the upper electrode (plate electrode) of the cell capacitor CAP.

Figure 17:
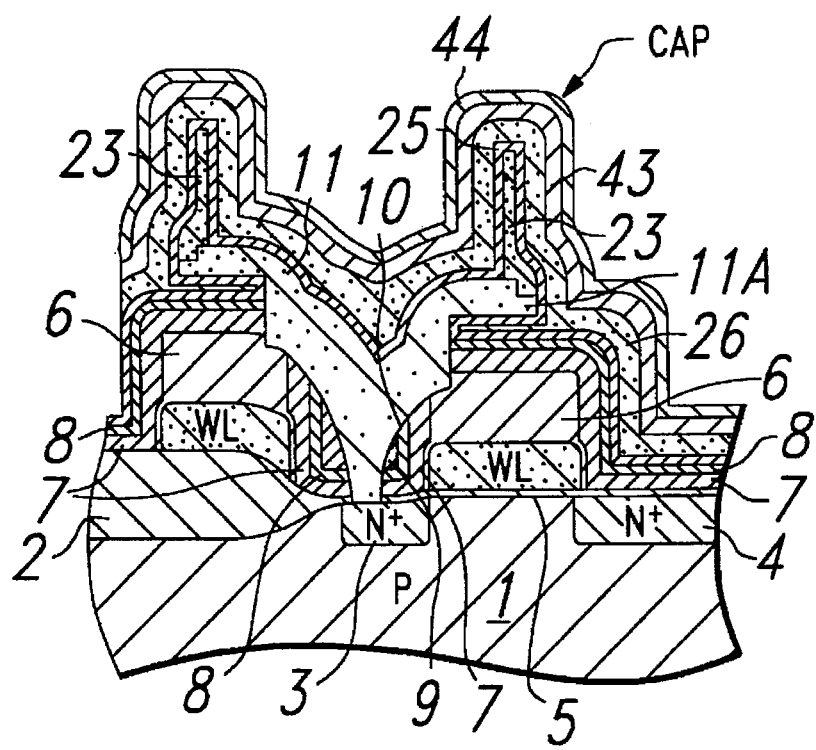
FIG. 17 is a cross section of another stage of the same.

Next, as shown in FIG. 17, a $SiO_2$ layer 43 is deposited on this upper electrode 26 to a thickness of 300 Å, and $SiO_2$ layer 44 is further deposited to a thickness of 85 Å by the CVD method.

Figure 18:
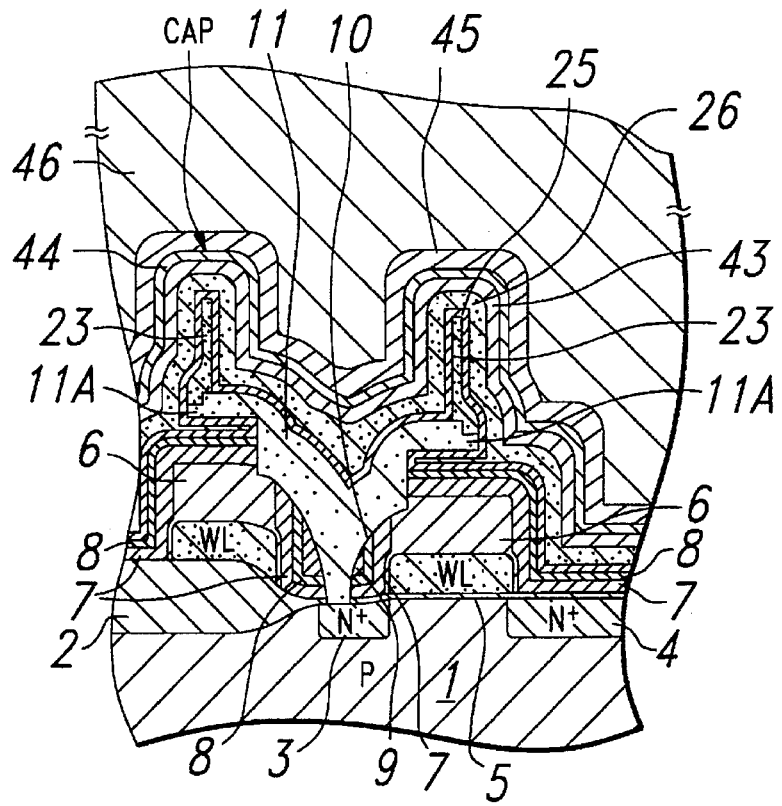
FIG. 18 is a cross section of another stage of the same.

Next, as shown in FIG. 18, $SiO_2$ layer 45 is deposited to a thickness of 500 Å, and $SiO_2$ layer 46 is stacked to a thickness of 10,000 Å thereon by the CVD method.

Figure 19:
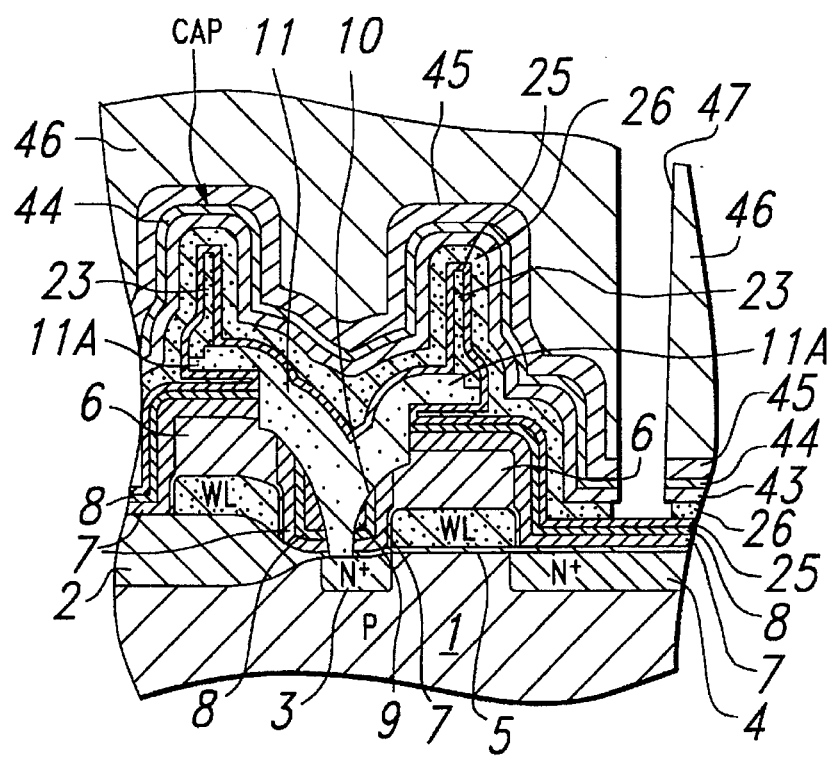
FIG. 19 a cross section of another stage of the same.

Next, as shown in FIG. 19, after etching $SiO_2$ layer 46, $SiO_2$ layer 46 as well as 45, 44, and 43 on $N^+$ drain region are selectively removed by dry etching, after which the base $SiO_2$ layer 6 is selectively removed, forming the hole 47 which serves as the contact hole.

Figure 20:
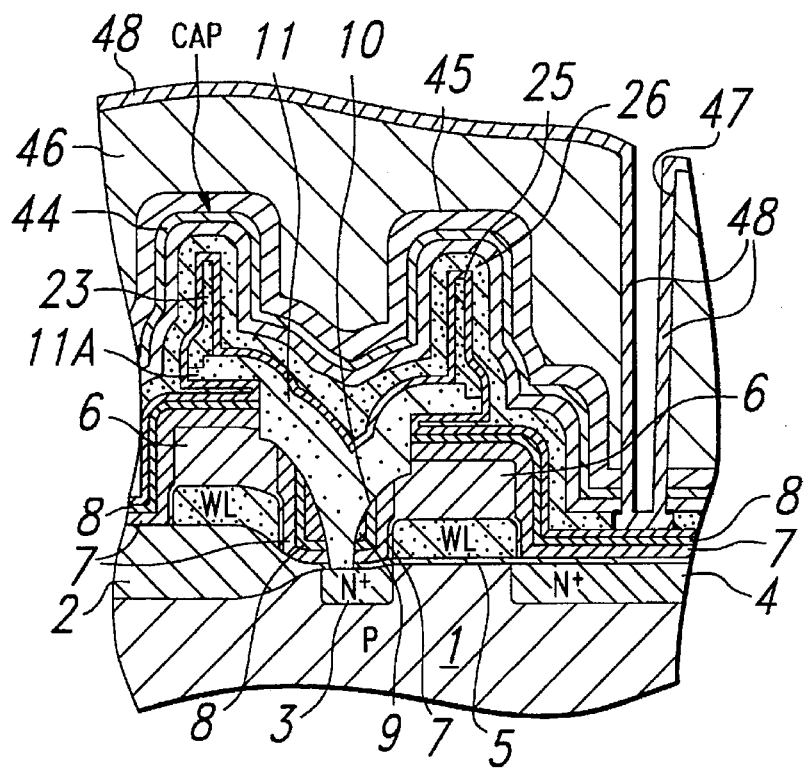
FIG. 20 is a cross section of another stage of the same.

Next, as shown in FIG. 20, a $Si_3N_4$ layer 8 is deposited to a thickness of 750 Å over the entire surface, including the hole 47, by the CVD method.

Figure 21:
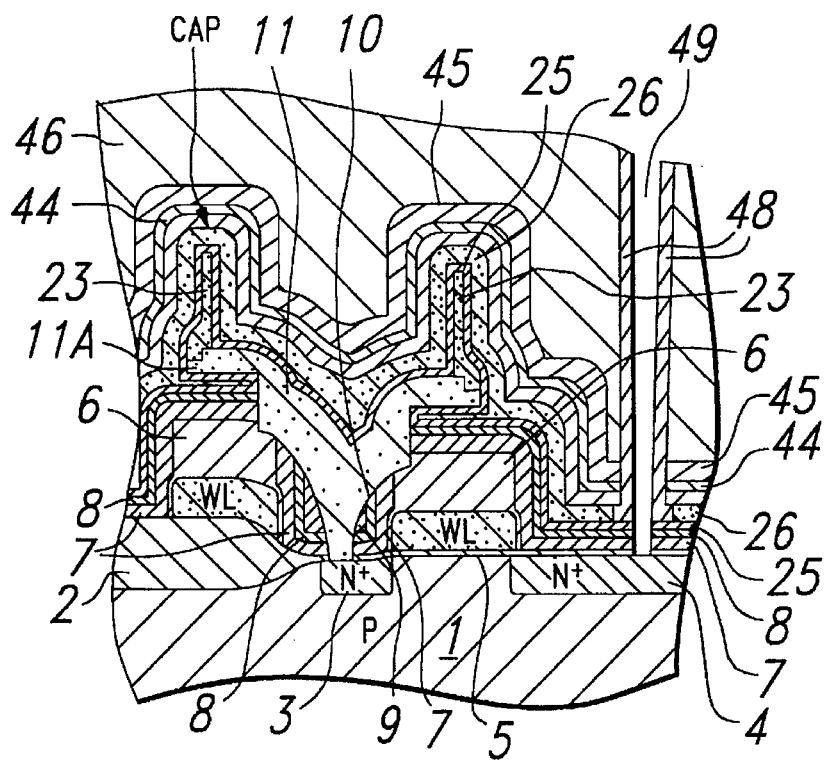
FIG. 21 is a cross section of another stage of the same.

Next, as shown in FIG. 21, the entire surface of $Si_3N_4$ layer 8 is etched, $Si_3N_4$ layer 8 is left only on the side surface of hole 48, and base $Si_3N_4$ layer 8 and $SiO_2$ layer 7 are successively removed by etching using this $Si_3N_4$ layer 8 as a mask. By this means, a contact hole 49 which reaches $N^+$ drain region 4 is formed.

Figure 22:
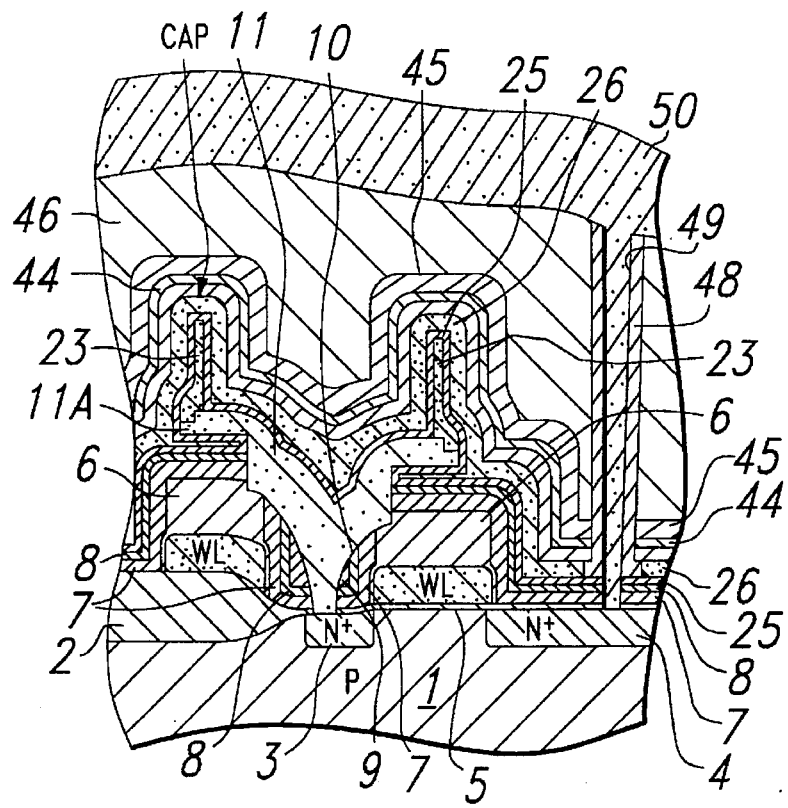
FIG. 22 is a cross section of another stage of the same.

Next, as shown in FIG. 22, a phosphorous-doped polysilicon layer 50 is deposited to a thickness of 5000 Å over the entire surface, including contact hole 49, by the CVD method.

Figure 23:
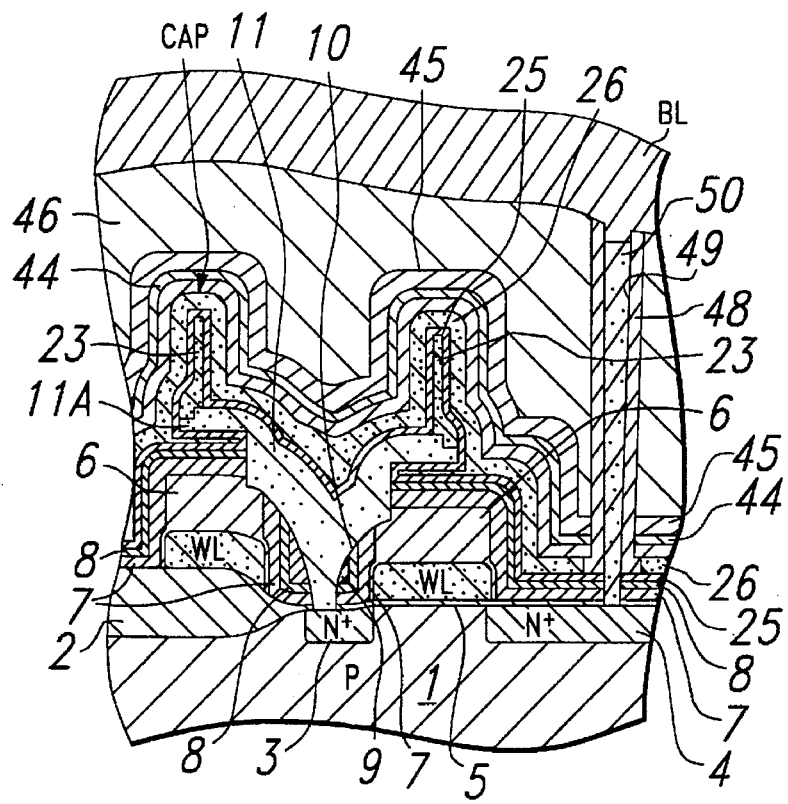
FIG. 23 is cross section of another stage of the same.
Figure 24:
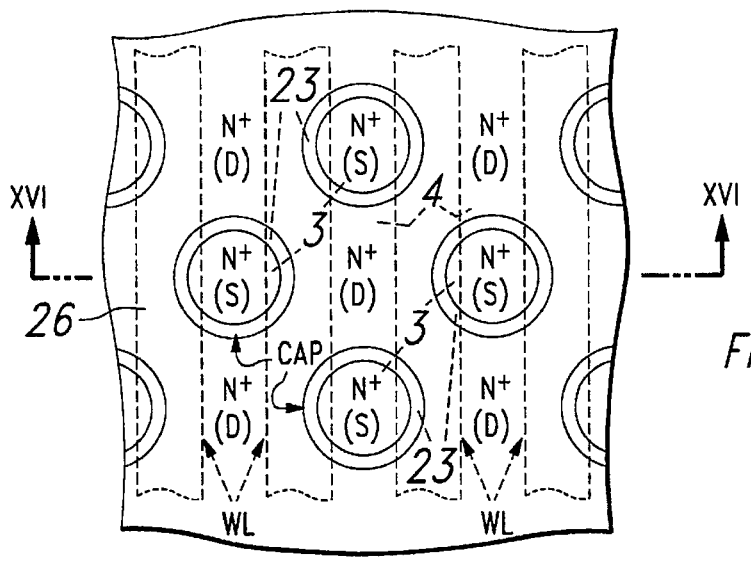
FIG. 24 is a key portion plan view corresponding to FIG. 16.

Next, as shown in FIG. 23, polysilicon layer 50 is etched back by etching of the entire surface, leaving it only in contact hole 49, after which tungsten is deposited on the entire surface by sputtering; this is then further patterned to form bit line BL.

In this manner, a memory cell can be manufactured for use, for example, in a 64 megabit dynamic RAM having a screen-type structure cylindrical stack cell capacitor CAP. The methods based on the present invention used in this manufacturing [process] have the following advantages.

That is, as is clear from the description given for FIGS. 9 through 12, a $Si_3N_4$ layer 31 having a lateral projection 31A is made at the time that polysilicon layer 23, which serves as the lower electrode of capacitor CAP, is etched into the screen-type structure, so that the polysilicon layer 23 directly beneath [the lateral projection 31A] is effectively protected by lateral projection 31A from the etching. Therefore even if the entire surface of polysilicon layer 23 is fully etched, it is possible to selectively leave polysilicon layer 23 on the outside surface of $SiO_2$ layer 22 to just the thickness (or height) under lateral projection 31A. In other words, it is possible to control the height of polysilicon layer 23 using the film thickness of the $SiO_2$ layer 22 which serves as a spacer. At the same time, polysilicon layer 23 can be more than adequately removed by etching from level differential 14 even if a substantial level differential 14 is present on the semiconductor substrate, so there is no remaining residue (see FIG. 24).

As a result, the lower electrode (polysilicon layer 23) of the screen-type structure can always be formed to a desired height and thickness, the capacitance of capacitor CAP can be increased and, as has already been described, there is no presence of polysilicon residue, so that there is no inter-capacitor shorting, and a memory cell capable of constant normal operation can be provided.

$SiO_2$ layer 32 is adhered to the outer surface of polysilicon layer 23 when the entire surface of polysilicon layer 23 is etched, making it possible to control the outer surface of the remaining polysilicon layer 23, and to maintain the desired thickness of polysilicon layer 23. In other words, when the deposition thickness of polysilicon layer 23 is determined, that thickness is maintained as is, so that controllability of the thickness is improved. Furthermore, by virtue of $SiO_2$ layer 32, there is no destruction of the outer surface of polysilicon layer 23, enabling a smoothing out [of this surface].

In this manner, the polysilicon layer 23 which serves as lower electrode can always be formed with good controllability to the desired height and thickness, controllable to a high accuracy on the order of several 10s of Å's.

Figure 25A:
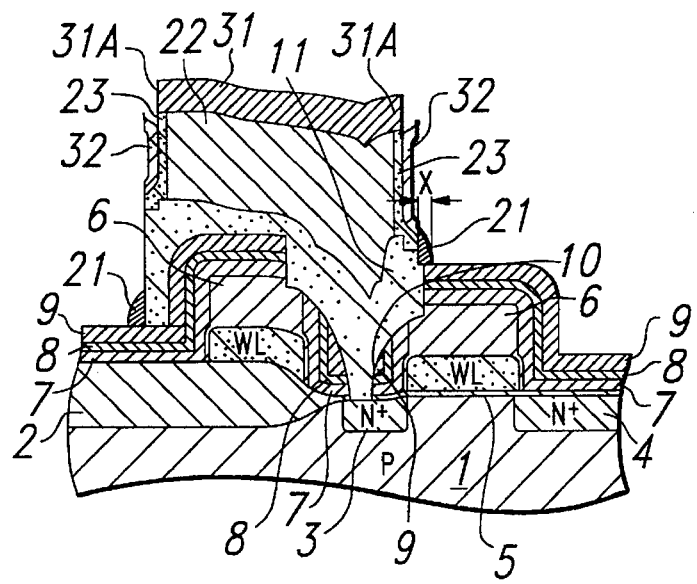
FIGS. 25A and 25B are a cross section explaining the phenomenon which occurs in the FIG. 12 stage.

Furthermore, as shown in FIG. 25, when the etching by-product 21 polymerized in the process shown in FIG. 12 adheres to the periphery of polysilicon layers 23 and 11, positional offset in the mask alignment when the $SiO_2$ layer 22 which serves as a spacer is patterned means that the $SiO_2$ layer 22 is not formed in the targeted position, as shown in FIG. 25(A), and etching by-product 21 will cover the polysilicon layer 11 on the source region 3 even if the terminal portion [of $SiO_2$ layer 22] is offset on source region 3.

Figure 25B:
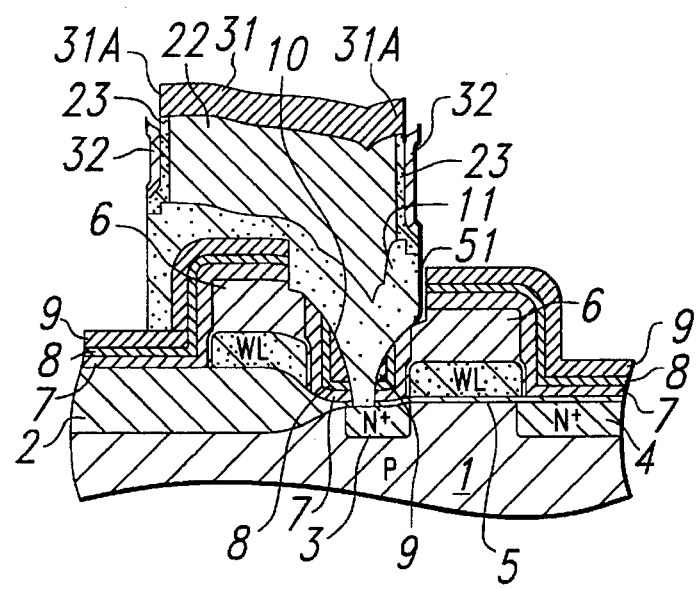

As a result, when polysilicon layer 23 and, further, polysilicon layer 11 are etched from the state shown in FIG. 11, etching by-product 21 acts to protect the polysilicon layer 11 on the source region 3 from etching. However, as indicated in FIG. 25(B), if etching by-product 21 is not present, then polysilicon layer 11 on the source region 3 may be etched and a hole 51 may open. This will produce problems such as difficulties in film formation at each subsequent layer, etc.

In order to resolve these problems, one can conceive of enlarging the pattern of the $SiO_2$ layer 22 which serves as a spacer so as to prevent the situation shown in FIG. 25(B) even if there is a positional offset, but there is a limit from a patterning technology standpoint to how large such patterns can be made. In this embodiment, the fact that the problem can be resolved as shown in FIG. 25(A) even without enlarging the $SiO_2$ layer 22 pattern is an advantage, and even if there is not an extreme positional offset such as that shown in FIG. 25(A), mask alignment at the time of $SiO_2$ layer 22 patterning can be carried out with an x-width margin of etching by-product 21, making it possible to expect an improved degree of integration on this point as well.

FIGS. 26 through 30 show a second embodiment in which the present invention is applied to a dynamic RAM.

Figure 26:
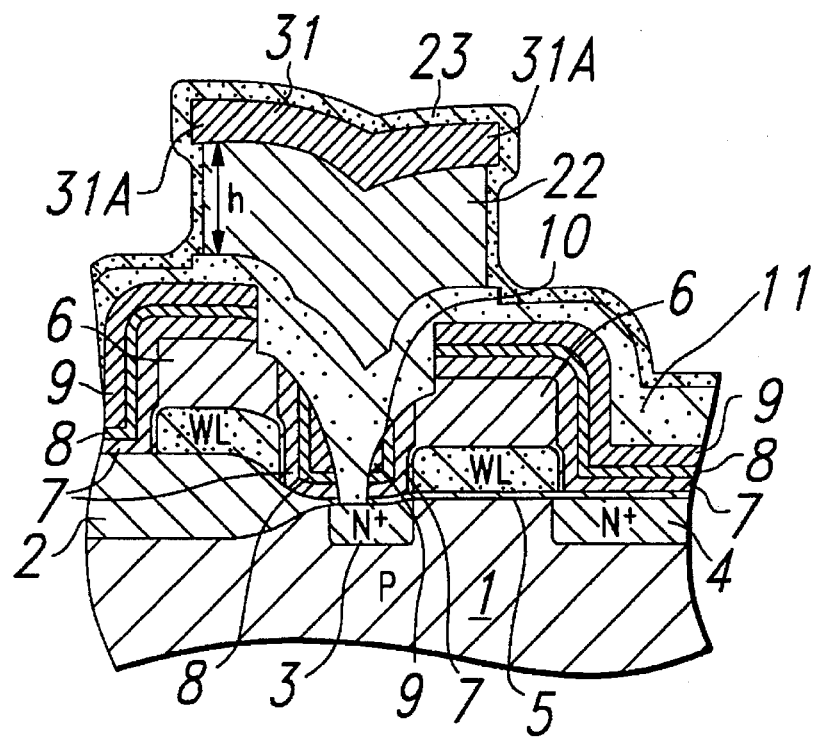
FIG. 26 is a cross section of one stage of a manufacturing process for a dynamic RAM memory cell in accordance with a second embodiment of the present invention.

According the this embodiment, the processes with respect to FIGS. 1 through 9 described above in the manufacture of a dynamic RAM memory cell are similar, but in subsequent processes, as shown in FIG. 26, a third layer phosphorous-doped silicon layer 23 is deposited to a thickness of 700 Å by the CVD method on the entire surface of $Si_3N_4$ layer 31, $SiO_2$ layer 22, and polysilicon layer 11. This polysilicon layer 23 becomes the screen material, and is also adhered to the periphery of lateral projection 31A of $Si_3N_4$ layer 31.

Figure 27:
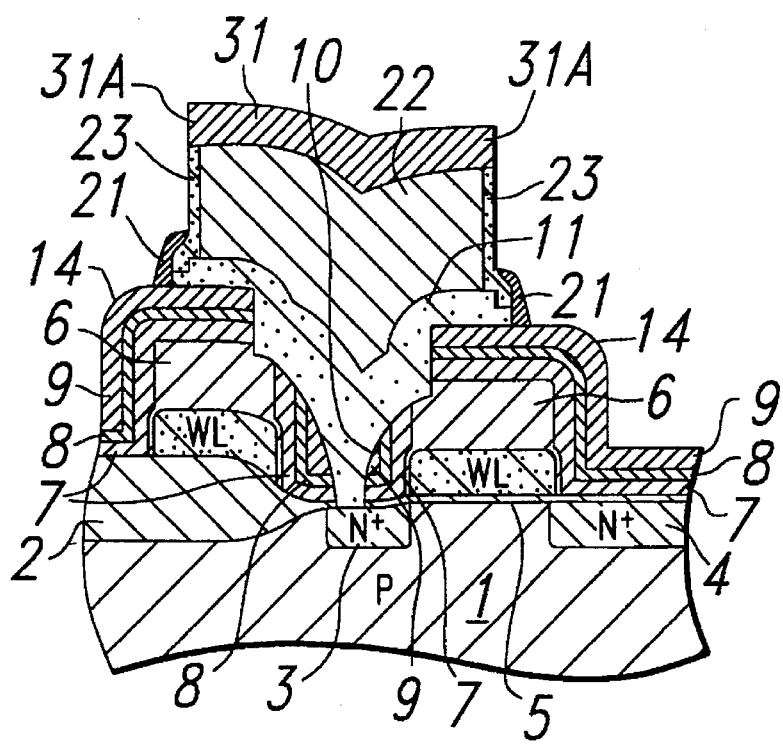
FIG. 27 is a cross section of another stage of the same.

Next, in contrast to the processes described in FIGS. 10 and 11, polysilicon layer 23 is etched over the entire surface by direct dry etching as shown in FIG. 27, and polysilicon layer 23 is selectively left as a side wall on only the outer surface (circumference) of $SiO_2$ layer 22 by etching. In this case, the $Si_3N_4$ layer 31 lateral projection 31A protects the polysilicon layer 23 directly thereunder from etching. It is thereby possible to selectively leave only the thickness (or height) under 31A of polysilicon layer 23 on the outside surface of $SiO_2$ layer 22.

Therefore when this etching occurs, of the polysilicon layer 23, the polysilicon layer 23 left on the outside surface of $SiO_2$ layer 22 is protected by lateral projection 31A of $Si_3N_4$ layer 31, and the polysilicon layer 23 under lateral projection 31A can be selectively left even when the polysilicon layer is fully etched from the state shown in FIG. 26, so that the unnecessary part thereof can be completely removed.

Figure 46:
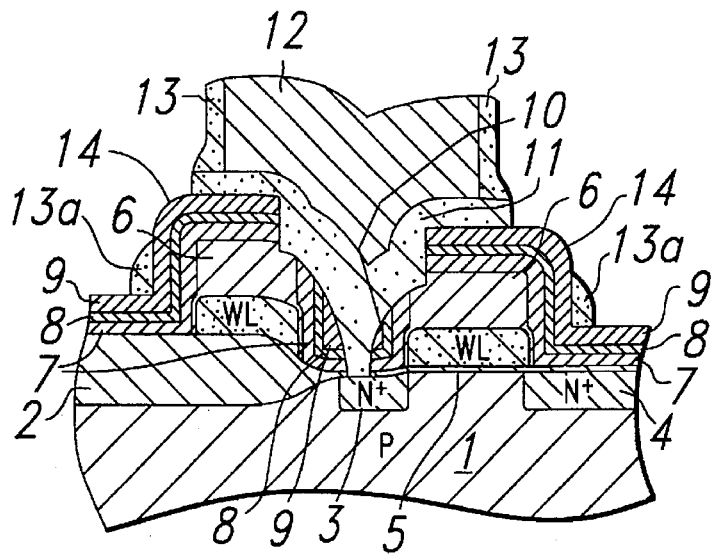
FIG. 46 is a cross section of another stage of the same.
Figure 47:
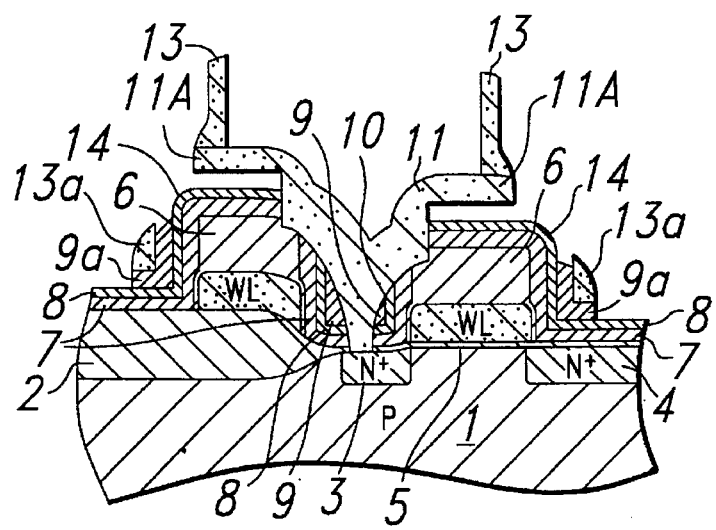
FIG. 47 is a cross section of another stage of the same.
Figure 48:
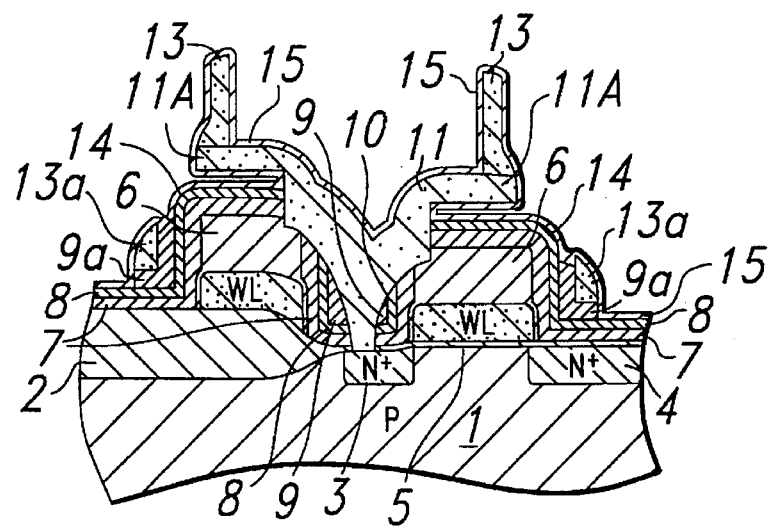
FIG. 48 is a cross section of another stage of the same.
Figure 49:
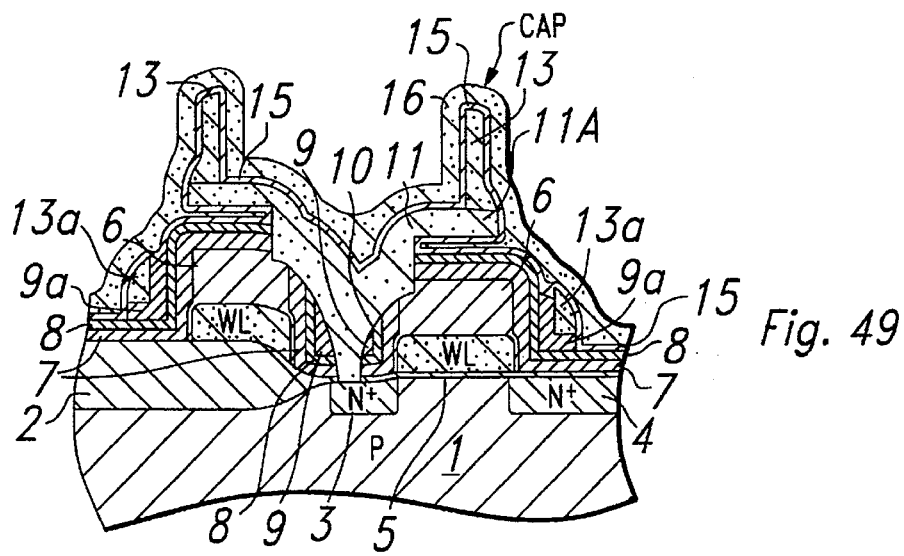
FIG. 49 is a cross section of another stage of the same (sectional diagram through line XXXXIX—XXXXIX in FIG. 44).
Figure 50:
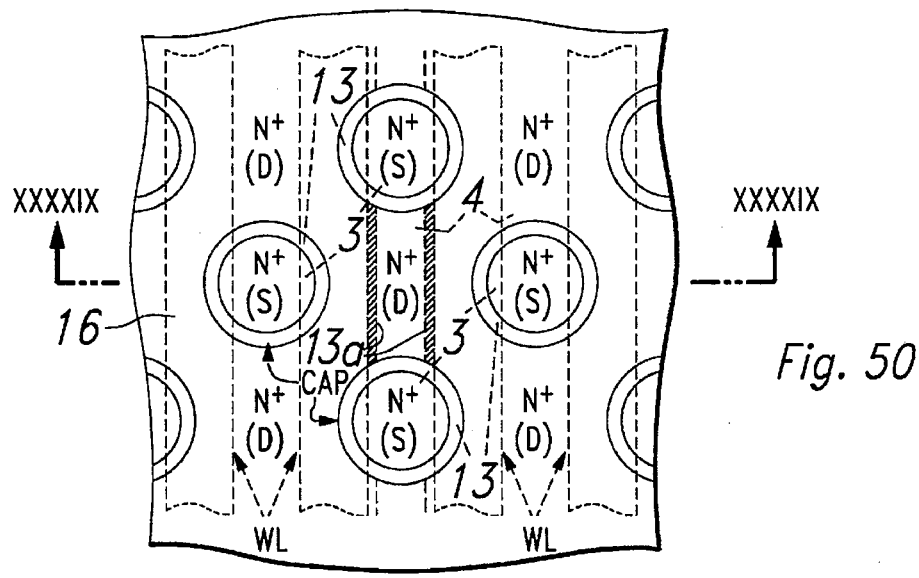
FIG. 50 is a key portion plan diagram corresponding to FIG. 49.
Figure 51:
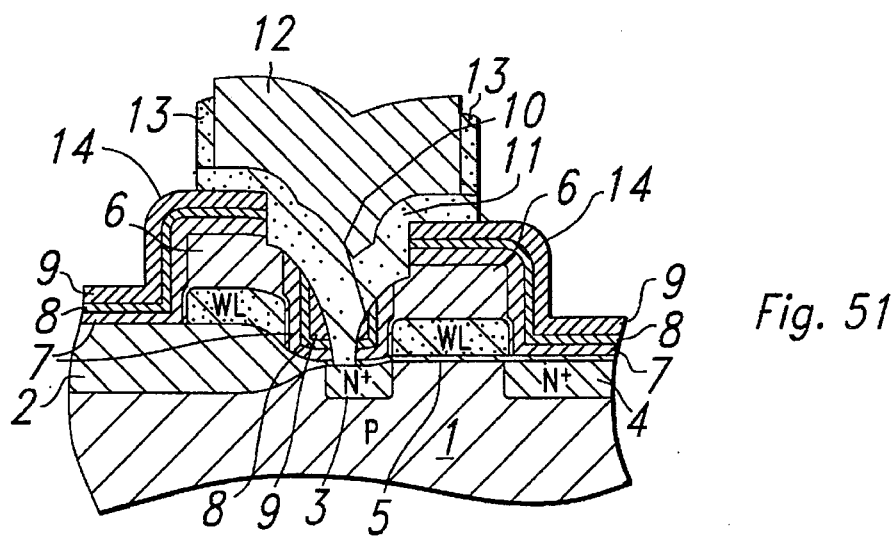
FIG. 51 is a similar cross section for the case in which etching is excessive in the FIG. 46 stage.

That is, polysilicon layer 23 on $Si_3N_4$ layer 31, as well as polysilicon layers 23 and 11 in the region outside $Si_3N_4$ layer 31 and $SiO_2$ layer 22, can be sufficiently removed, while they can also be completely removed from the level differential 14, and there is no occurrence of polysilicon residue at level differential 14 such as the residue 13a described by FIG. 46.

However, because etching of the polysilicon layer is performed sufficiently due to the existence of $Si_3N_4$ layer 31 lateral projection 31A, there is a tendency for deposits (etching by-products) 21, which are polymerized by polysilicon etching, to adhere to the periphery of polysilicon layers 23 and 11 as shown in FIG. 27. As is described below, these deposits 21 have an advantageous effect particularly on the etching of polysilicon layer 11 and, further, on mask alignment when forming $SiO_2$ layer 22; illustration thereof is omitted after FIG. 28.

Figure 28:
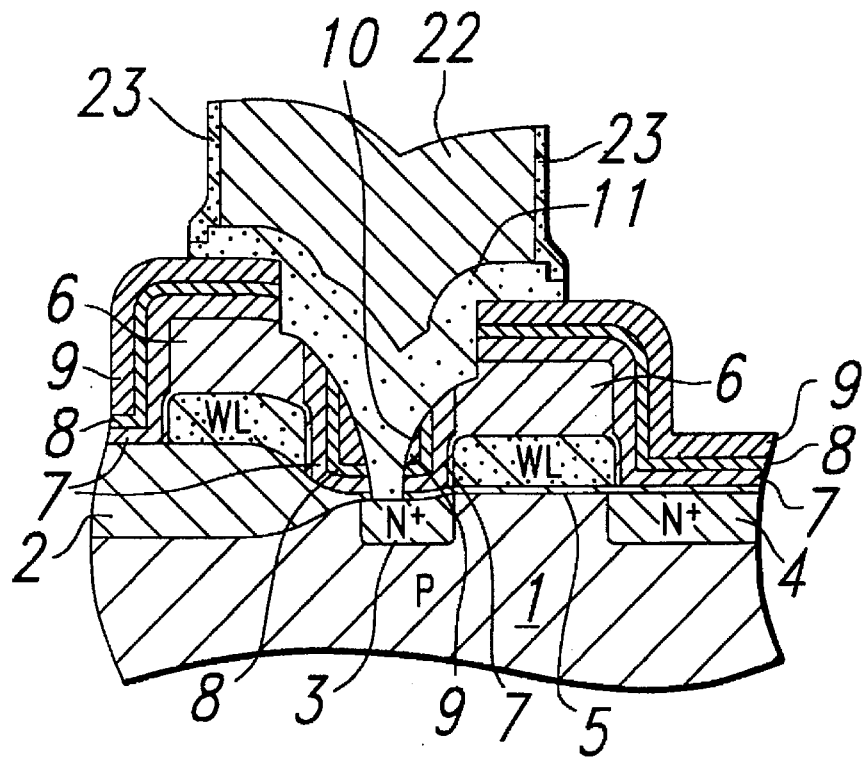
FIG. 28 is a cross section of another stage of the same.

Next, as shown in FIG. 28, $Si_3N_4$ layer 31 is removed by etching with hot phosphoric acid, exposing $SiO_2$ layer 22 which serves as a spacer. In this case, it is necessary to use a sufficiently fast $Si_3N_4$ layer 31 etching rate with respect to polysilicon layers 23 and 11.

Figure 29:
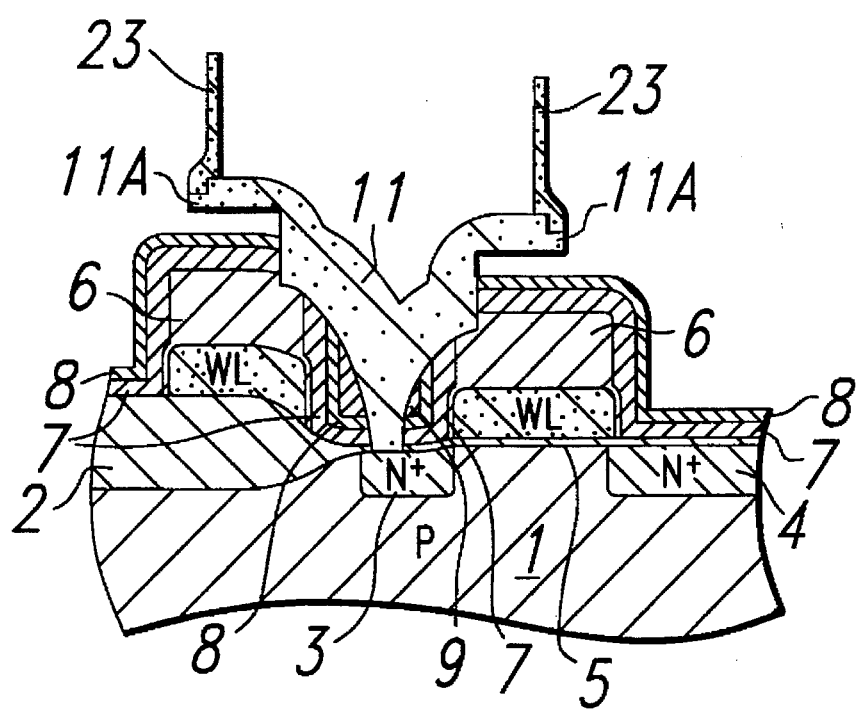
FIG. 29 is a cross section of another stage of the same.

Next, as shown in FIG. 29, $SiO_2$ layers 22 and 9 are removed by etching with fluoric acid and polysilicon layer 23 is exposed as a cylinder forming one of the capacitor electrodes, while fin portion 11A is formed on polysilicon layer 11. In this case as well, it is necessary to use a sufficiently fast etching rate on $SiO_2$ layers 22 and 9 with respect to polysilicon layers 23 and 11.

The processes hereafter are the same as those described for FIGS. 15 through 23, so a description thereof is omitted.

In this manner, according to this embodiment, a memory cell can be manufactured for use, for example, in a 64 megabit dynamic RAM having a screen-type structure cylindrical stack cell capacitor CAP. The methods based on the present invention used in this manufacturing [process] have the same following advantages described above.

That is, as is clear from the description given for FIGS. 26 through 27, a $Si_3N_4$ layer 31 having a lateral projection 31A is provided at the time that polysilicon layer 23 which serves as the lower electrode of capacitor CAP is etched into the screen-type structure, so that the polysilicon layer 23 directly thereunder is effectively protected by the lateral projection 31A from the etching. Therefore even if the entire surface of polysilicon layer 23 is fully etched, it is possible to selectively leave polysilicon layer 23 on the outside surface of $SiO_2$ layer 22 in just the thickness (or height) under lateral projection 31A. In other words, it is possible to control the height of polysilicon layer 23 using the film thickness of the $SiO_2$ layer 22 which serves as a spacer. At the same time, the polysilicon layer 23 can be more than adequately removed by etching from level differential 14 even if a substantial level differential 14 is present on the semiconductor substrate, so that there is no remaining residue (see FIG. 24).

As a result, the lower electrode (polysilicon layer 23) of the screen-type structure can always be formed to a desired height and thickness, the capacitance of capacitor CAP can be increased and, as has already been described, there is no presence of polysilicon residue, so that there is no inter-capacitor shorting, and a memory cell capable of constant normal operation can be provided.

Figure 30A:
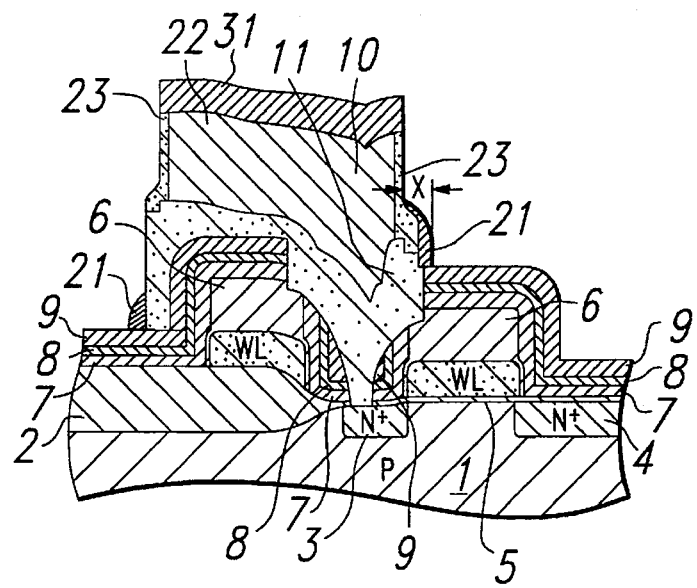
FIGS. 30A and 30B are a cross section explaining the phenomenon which occurs in the FIG. 27 stage.

Furthermore, as shown in FIG. 30, when the etching by-product 21 polymerized in the process [shown in] FIG. 27 adheres to the periphery of polysilicon layers 23 and 11, positional offset in the mask alignment when the $SiO_2$ layer 22 which serves as a spacer is patterned means that the $SiO_2$ layer 22 is not formed in the targeted position, as shown in FIG. 30(A), and etching by-product 21 will cover the polysilicon layer 11 on source region 3 even if the terminal portion [of $SiO_2$ layer 22] is offset on source region 3.

Figure 30B:
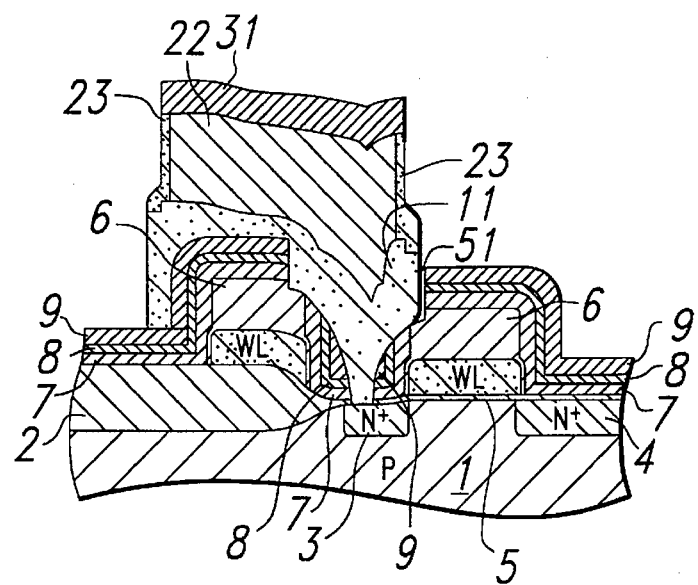

As a result, when polysilicon layer 23 and, further, polysilicon layer 11 are etched from the state shown in FIG. 26, etching by-product 21 acts to protect the polysilicon layer 11 on source region 3 from etching. However, as indicated in FIG. 30(B), if etching by-product 21 is not present, then polysilicon layer 11 on source region 3 may be etched and a hole 51 may open. This will produce problems such as difficulties in film formation in each subsequent layer, etc.

In order to resolve these problems, one can conceive of enlarging the pattern of $SiO_2$ layer 22 which serves as a spacer so as to prevent the situation shown in FIG. 30(B) even if there is a positional offset, but there is a limit from a patterning technology standpoint to how large such patterns can be made. In this embodiment, the fact that the problem can be resolved as shown in FIG. 30(A) even without enlarging the $SiO_2$ layer 22 pattern is an advantage, and even if there is not an extreme positional offset such as that shown in FIG. 30(A), mask alignment at the time of $SiO_2$ layer 22 patterning can be performed with an x-width margin of etching by-product 21, making it possible to expect an improved degree of integration on this point as well.

FIGS. 31 through 36 show a third embodiment in which the present invention is applied to a dynamic RAM.

Figure 31:
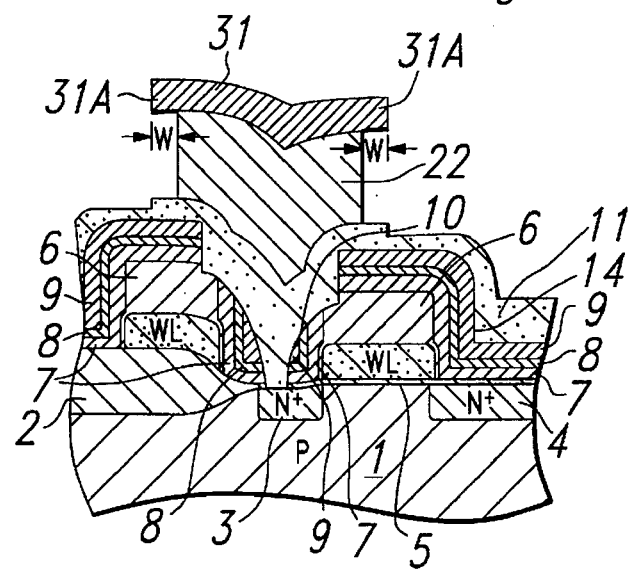
FIG. 31 is a cross section of one stage of a manufacturing process for a dynamic RAM memory cell in accordance with a third embodiment of the present invention.

According to this embodiment, in the manufacture of a dynamic RAM memory cell the processes described above in the first embodiment for FIGS. 1 through 8 are carried out in the same manner, but subsequently, as shown in FIG. 31, a lateral projection 31A having a width of 1700 Å is formed in the $Si_3N_4$ layer in the $SiO_2$ layer 22 etching process, using a $SiO_2$ layer 22 side undercut width of 1700 Å.

Figure 32:
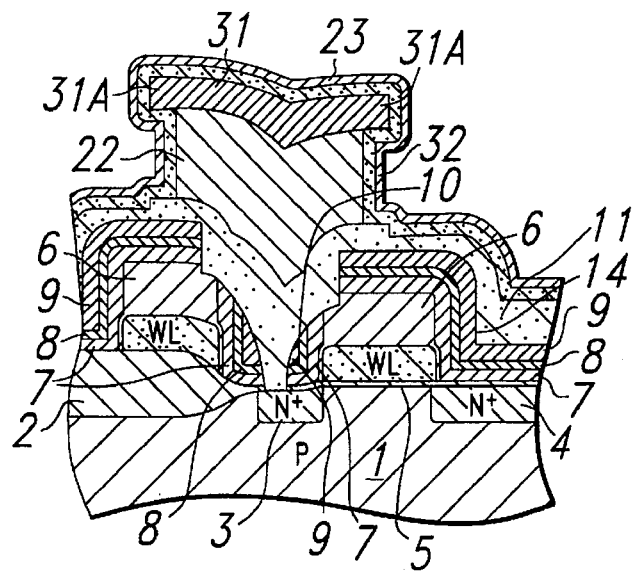
FIG. 32 is a cross section of another stage of the same.

Next, as shown in FIG. 32, a third layer phosphorous-doped silicon layer 23 is deposited to a thickness of 700 Å by the CVD method on the entire surface of $Si_3N_4$ layer 31, $SiO_2$ layer 22, and polysilicon layer 11. This polysilicon layer 23 becomes the screen material, and is also adhered to the periphery of lateral projection 31A of $Si_3N_4$ layer 31. A $SiO_2$ layer 32 is further deposited on polysilicon layer 23 as a protective film to a thickness of 450 Å by the CVD method (temperature 800° C.). Polysilicon layer 23 is amorphous silicon at the time of deposition and is heated to become polysilicon.

Figure 33:
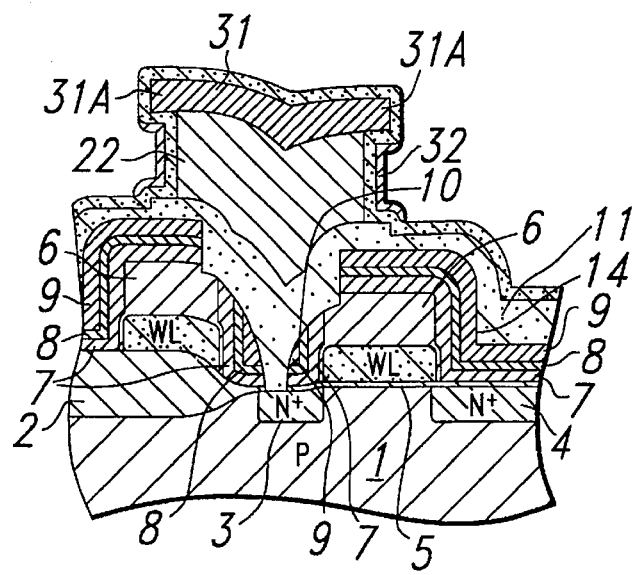
FIG. 33 is a cross section of another stage of the same.

Next, as shown in FIG. 33, the entire surface of $SiO_2$ layer 32 is etched, and a portion of $SiO_2$ layer 32 is selectively left in the form of a sidewall on only the surface portion of polysilicon layer 23 positioned under lateral projection 31A on $Si_3N_4$ layer 31.

Figure 34:
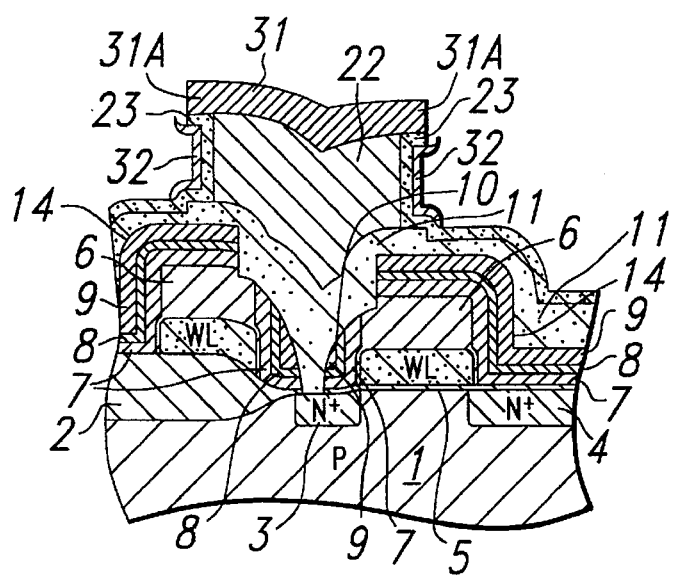
FIG. 34 is a cross section of another stage of the same.

Next, as shown in FIG. 34, polysilicon layer 23 is etched over the entire surface by direct dry etching, and, by etching back, a portion of polysilicon layer 23 is selectively left as a sidewall on only the outside surface (circumference) of $SiO_2$ layer 22. In this case, the polysilicon layer 23 positioned under lateral projection 31A is protected from etching by the lateral projection 31A of $Si_3N_4$ layer 31 and side-wall shaped $SiO_2$ layer 32. Furthermore, side-wall shaped $SiO_2$ layer 32 protects the outside of polysilicon layer 23 on the outside surface of $SiO_2$ layer 22. It is thus possible on the outside surface of $SiO_2$ layer 22 to selectively remove just the thickness of polysilicon layer 23 deposited thereon.

Therefore when this etching occurs, of the polysilicon layer 23, that polysilicon layer 23 which is left on the outside surface of $SiO_2$ layer 22 is protected by the lateral projection 31A of $Si_3N_4$ layer 31, and the polysilicon layer 23 under lateral projection 31A can be selectively left even when the polysilicon layer is fully etched from the state shown in FIG. 33, so that the unneeded part thereof can be completely removed, and the outer surface of the remaining polysilicon layer 23 will be smooth.

That is, polysilicon layer 23 on $Si_3N_4$ layer 31, as well as polysilicon layers 23 and 11 in the region outside $Si_3N_4$ layer 31 and $SiO_2$ layer 22, can be sufficiently removed, while they can also be completely removed from level differential 14, and there is no occurrence of polysilicon residue at level differential 14 such as the residue 13a described by FIG. 46, nor is the outer surface of the remaining polysilicon layer 23 destroyed by etching.

However, because etching of the polysilicon layer is sufficiently performed due to the existence of $Si_3N_4$ layer 31 lateral projection 31A, there is a tendency for deposits (etching by-products) 21, which are polymerized by polysilicon etching, to adhere to the periphery of polysilicon layers 23 and 11 in the same manner as in the first embodiment (see FIG. 12); this is omitted in FIGS. 24 through 36.

Figure 35:
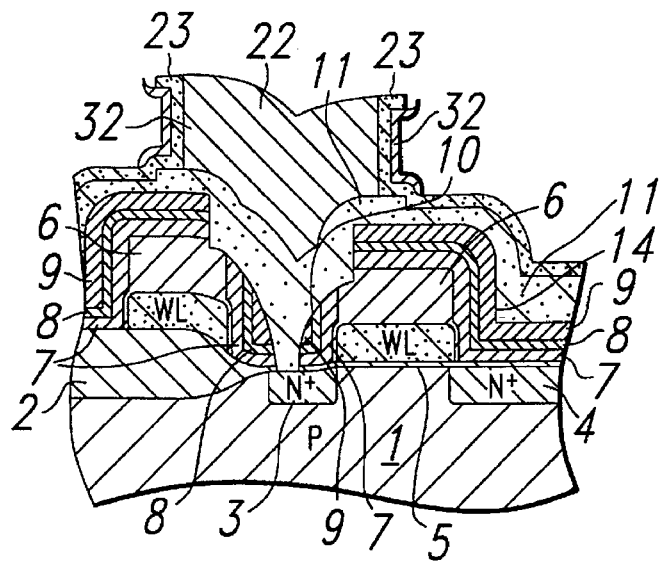
FIG. 35 is a cross section of another stage of the same.

Next, as shown in FIG. 35, $Si_3N_4$ layer 31 is removed by etching with hot phosphoric acid, exposing the $SiO_2$ layer 22 which serves as a spacer. In this case, it is necessary to use a sufficiently fast $Si_3N_4$ layer 31 etching rate with respect to polysilicon layers 23 and 11.

Figure 36:
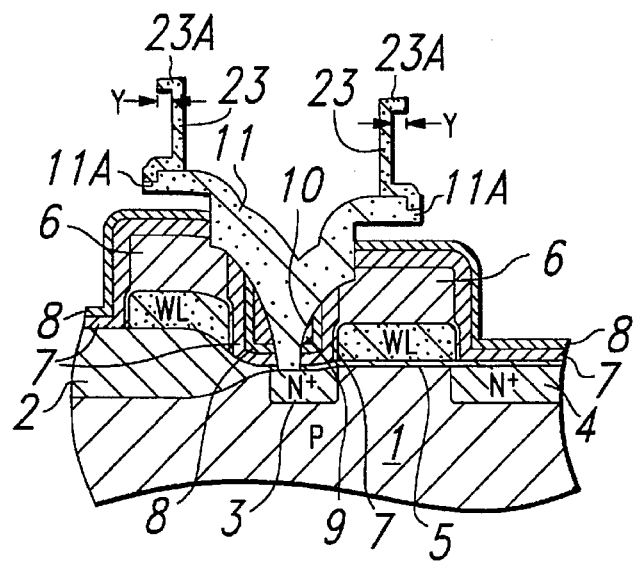
FIG. 36 is a cross section of another stage of the same.

Next, as shown in FIG. 36, $SiO_2$ layers 22, 32, and 9 are removed by etching with fluoric acid, and polysilicon layer 23 is exposed in a shape having a fringe portion (or flange portion) 23A as one of the capacitor electrodes, while fin portion 11A is formed on polysilicon layer 11. In this case as well, it is necessary to use a sufficiently fast etching rate on $SiO_2$ layers 22, 32, and 9 with respect to polysilicon layers 23 and 11.

The processes hereafter are the same as those described for FIGS. 15 through 23, so a description thereof is omitted.

In this manner, according to this embodiment, a screen-type structure stack cell capacitor can be formed having on its upper portion a fringe portion whose shape follows that of fringe portion 23A, so that in addition to the advantages described above for the first embodiment, this embodiment also has the following advantages.

That is, a fringe portion 23A is formed on the upper portion of the polysilicon layer 23 which forms the screen-type structure, so that it is possible to increase the surface area of the cell capacitor electrode and [thereby] increase the capacitance of the capacitor. The protrusion width y of this fringe portion 23A can be freely set by adjusting the $SiO_2$ layer 22 side surface undercut width w and the deposition thickness of polysilicon layer 23.

Figure 37:
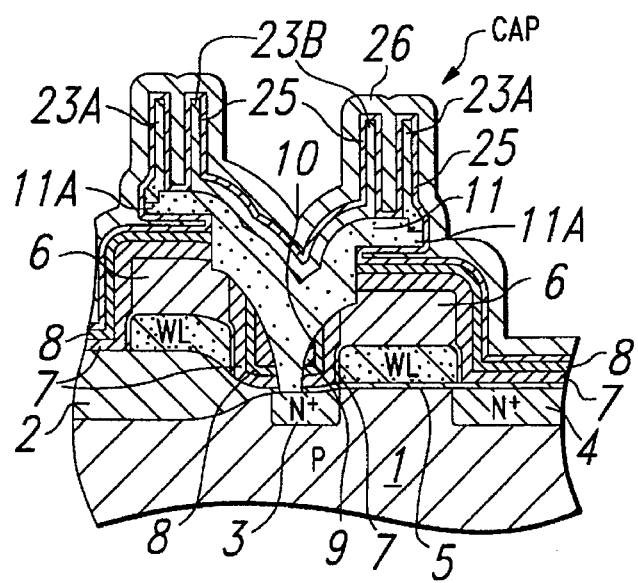
FIG. 37 is a cross section of one stage of a manufacturing process for a dynamic RAM memory cell in accordance with a fourth embodiment of the present invention.

FIG. 37 shows a fourth embodiment in which the present invention is applied to a dynamic RAM.

According to this embodiment, in contrast to the embodiments described above, the screen-type structure stack cell capacitor CAP is formed in a circular pattern concentric to polysilicon layer 23A and to cylindrical polysilicon layer 23B which stands vertically in a position within [polysilicon layer 23A].

It is therefore possible, in comparison with the other embodiments described above, to greatly increase capacitor electrode surface area, which is to say capacitance, using the polysilicon layer 23B in the center position. This polysilicon layer 23B can be formed by making a ring-shaped opening in a position within $Si_3N_4$ layer 31 in the process shown in FIG. 9, etching $SiO_2$ layer 22 to the shape of this opening, and executing the processes subsequent to [that shown] in FIG. 10 (or FIG. 26).

FIGS. 38 through 42 show a fifth embodiment of the present invention. In this embodiment, the present invention is applied not to the dynamic RAM memory cell described above, but to interconnection wiring formed on a semiconductor substrate.

Figure 38:
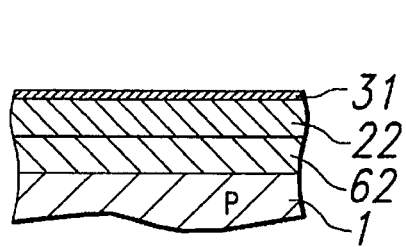
FIG. 38 is a cross section of one stage of a manufacturing process for an interconnect wiring structure in accordance with a fifth embodiment of the present invention.

That is, as shown in FIG. 38, $SiO_2$ layer 22 and $Si_3N_4$ layer 31 are first successively stacked onto an insulating layer 62 (field $SiO_2$ film, etc.) formed on semiconductor substrate 1 by the CVD method. The film forming conditions can be the same as those described by FIG. 7.

Figure 39:
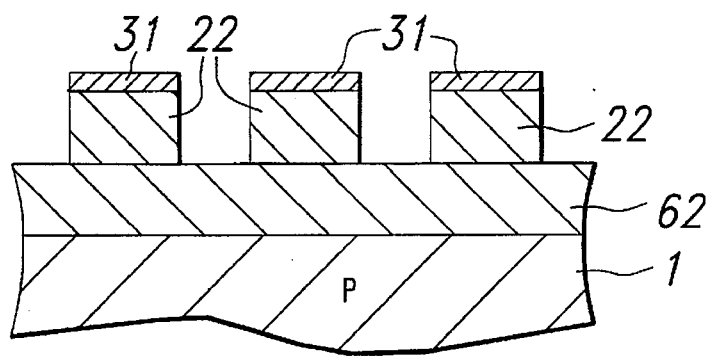
FIG. 39 is a cross section of another stage of the same.

Next, as shown in FIG. 39 and as described for FIG. 8, $Si_3N_4$ layer 31 and $SiO_2$ layer 22 are etched to the same pattern and left remaining, separated into interconnect wiring patterns.

Next, as shown in FIG. 40, $SiO_2$ layer 22 is under-etched using $Si_3N_4$ layer 31 as a mask, in the same manner as described in FIG. 8, and lateral projections 31A are formed in each of the $Si_3N_4$ layers 31.

Figure 41:
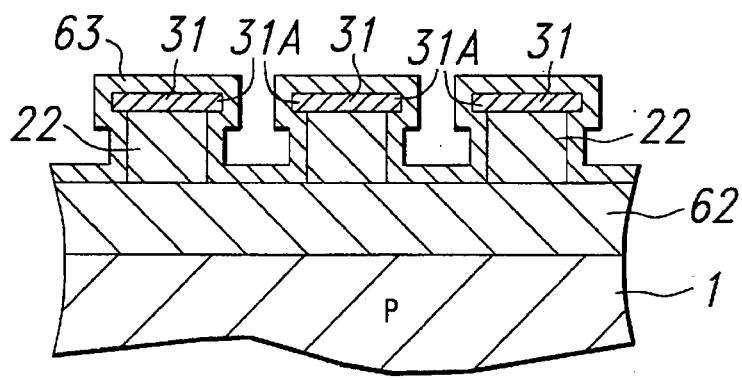
FIG. 41 is a cross section of another stage of the same.

Next, as shown in FIG. 41, phosphorous-doped polysilicon layer 63 is deposited on the entire surface in the same manner as described for FIG. 26 (or FIG. 10) as an interconnect wiring material.

Figure 42:
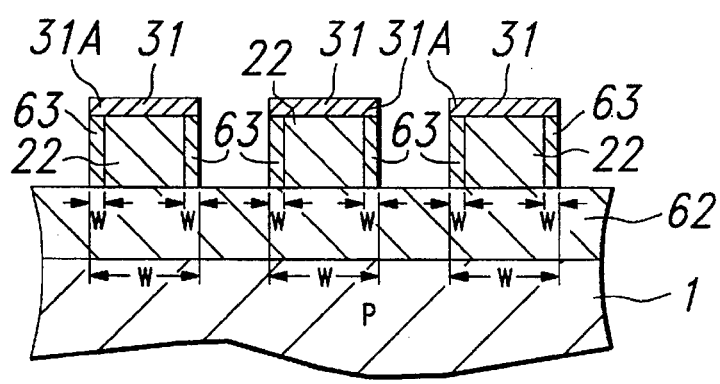
FIG. 42 is a cross section of another stage of the same.
Figure 43:
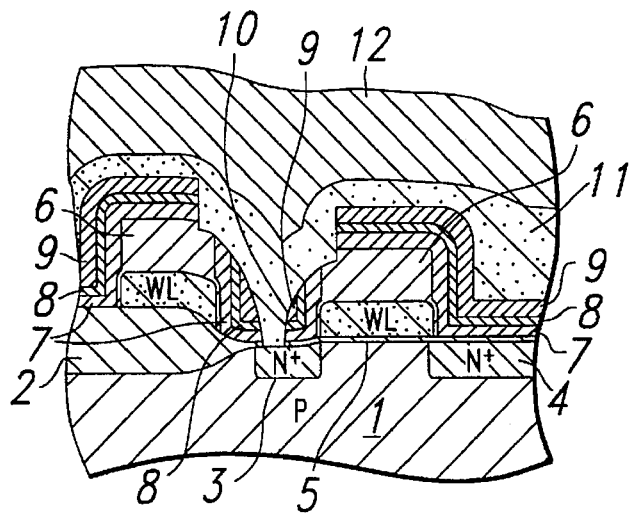
FIG. 43 is a cross section of another stage of the same.
Figure 44:
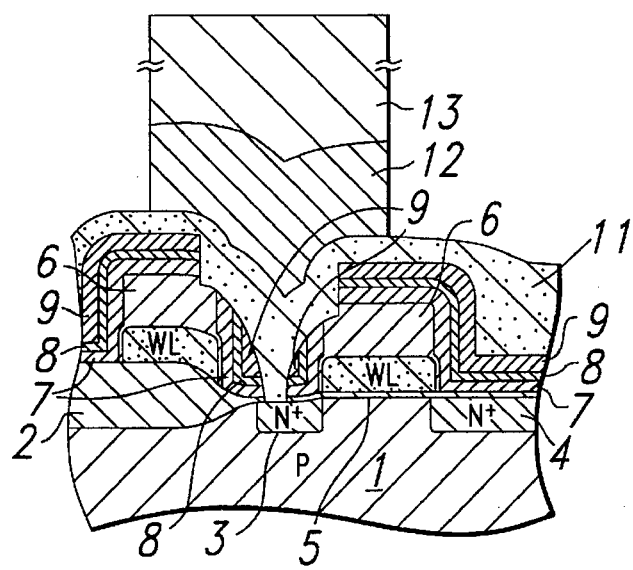
FIG. 44 is a cross section of one stage of a manufacturing process for a dynamic RAM memory cell in accordance with conventional examples.
Figure 45:
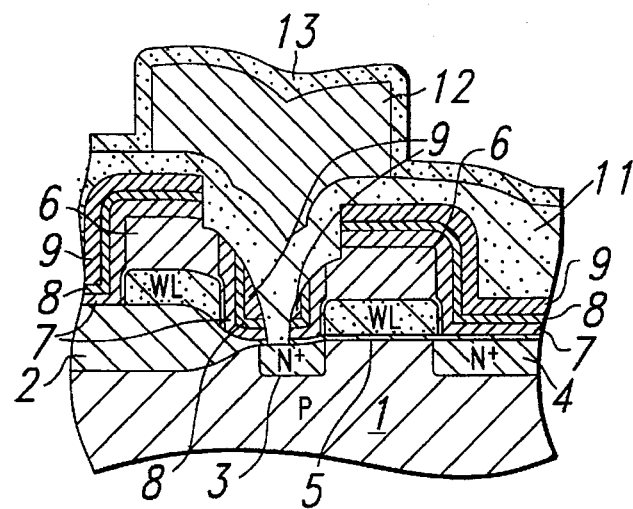
FIG. 45 is a cross section of another stage of the same.

Next, as shown in FIG. 42, polysilicon layer 63 is etched over its entire surface in the same manner as described for FIG. 27 (or FIG. 12), and polysilicon layer 63 is left only directly beneath the lateral projection 31A of $Si_3N_4$ layer 31.

In this manner, polysilicon layer 63 is formed into multiple fine interconnect wires (that is, having a wire width of approximately 700 Å) on the semiconductor substrate.

The interconnect wiring width and height of this interconnect wiring 63 can be controlled constantly to a desired value by the use of $Si_3N_4$ layer 31 lateral projection 31A and spacer 22, so a much finer patterning is possible when compared to that formed using optical patterning in standard photolithography.

This is because by simply determining the $Si_3N_4$ layer 31 patterning accuracy, subsequent under-etching of $SiO_2$ layer 22 and full-surface etching of polysilicon layer 63 using $Si_3N_4$ layer 31 as a mask can be carried out by self-alignment without going through any optical processes such as mask alignment, etc. That is to say, it is necessary to form $Si_3N_4$ layer 31 by optical patterning, but polysilicon layer 63 can be formed accurately to line width w with self alignment simply by forming width W using that optical patterning.

Above we have described embodiments of the present invention; the embodiments described above can be further varied based on the technical concepts of the present invention.

For example, the degree of protrusion of the $Si_3N_4$ layer 31 lateral projection 31A described above can be varied according to the degree of under-etching of $SiO_2$ layer 22, but depending on this degree of under-etching (in other words, the degree of protrusion of lateral projection 31A), the thickness thereof can be controlled so that no more than the necessary quantity is removed when the polysilicon layer 23 to be left on the outer side of $SiO_2$ layer 22 is etched over its entire surface.

The screen-type structure described above can also be given various forms, and its sectional shape, planar pattern, etc. are not limited to that which is described above. The interconnect structure described in FIG. 42 may be used as is or comprised in various [other] ways, such as by removing $Si_3N_4$ layer 31 and depositing an insulation film over the entire surface, etc.

The material comprising the above-described screen-type structure and the materials, thickness, and film formation method for each of the layers used in the fabrication thereof may also be changed. The screen-type structure is not limited to what is described above, and may also be applied to other functional portions.

For example, in the case in which $Si_3N_4$ layer 8 is selectively adhered to the contact hole in FIGS. 20 and 21, it is possible, as a variation of the embodiment described above, to selectively leave $Si_3N_4$ layer 8 on the side wall of the contact hole by first forming a $Si_3N_4$ layer and then forming a lateral projection in such a way that it protrudes into the contact hole, depositing $SiO_2$ and etching the entire surface thereof. It is also possible to form an $SiO_2$ layer as a standard side wall using the $Si_3N_4$ lateral projection described above (this can applied to the side wall on the side of word line WL).

The present invention, in addition to [use in] dynamic RAM having stack cell capacitors as described above, can also be given a structure in which, for example, the above-described stack cell capacitor is positioned on a $SiO_2$ film, and the lower electrode of this capacitor is extended so as to connect with the transfer gate source region. Also, the above-described semiconductor region conduction type can be varied, and the present invention can also be applied to other parts of a semiconductor memory, to other devices, etc.

OPERATIONAL EFFECTS OF THE INVENTION

As is described above, the present invention has a process for forming a first layer (for example, the $SiO_2$ layer 22 which serves as a preform or spacer described above) on a base (for example, the polysilicon layer 11 or the semiconductor substrate 1 described above), a process for stacking a second layer (for example, the nitride layer 31 described above) on the first layer, a process for processing the second layer and the first layer into virtually the same pattern, a process in which, by etching the outside surface of the first layer using the second layer as a mask after this processing, the second layer is caused to project (that is, to form a lateral projecting structure) on the region removed by this etching, a level differential in which a third layer (for example, the polysilicon layer 23 which serves as the capacitor lower electrode described above) is adhered from the second layer and the first layer, including this projected portion, to the substrate, and a process in which the third layer is etched such that a portion of the third layer remains on the outside surface of the first layer directly beneath the projecting portion of the second layer, so that the third layer is effectively protected from etching directly underneath the second layer projecting portion. Therefore even when this third lay is fully etched, just the thickness (or height) under the lateral projecting portion of this third layer can be selectively left on the side outside surface of the first layer, while at the same time removal of the third layer at the level differential can also be more than adequately accomplished by etching, even when the level differential is quite substantial on the substrate, such that no residue remains.

As a result, a semiconductor can be provided in which a third layer of a screen-type structure can always be formed to the desired height and thickness, and there is no third layer etching residue present and therefore no shorting, etc. between capacitors, thus enabling constant normal operation.

Also, when third layer etching by-product adheres to the periphery of the third layer, the etching by-product will not be formed on the targeted position due to the mask alignment positioning offset at the time of patterning of the first layer, but will cover the terminal thereof even if the terminal position is offset.

As a result, because the etching by-product has the effect of protecting the base from etching when the third layer is etched, mask alignment at the time of first layer patterning can be performed with at least a degree of margin equal to the width of the etching by-product; on this point as well an improvement in degree of integration may be expected.

We claim:

1. A semiconductor manufacturing method for a cylindrical electrode, comprising the steps of:

providing a base layer;

depositing a preform layer of $SiO_2$ of depth h on the base layer;

depositing a working layer of $Si_3N_4$ on the preform layer;

etching the working and preform layers into an island so the working and preform layers each have a respective peripheral surface;

using the working layer as a mask, acid etching the peripheral surface of the preform layer so that a projecting portion of the working layer projects over the preform layer a distance w;

CVD depositing a first electrode layer of amorphous silicon to cover the working and preform layers, including the projecting portion of the working layer, and the base layer, and heating the first electrode layer to convert its amorphous silicon to conducting polysilicon;

direct dry etching away the first electrode layer so that only a remainder portion of height h and thickness w remains on the peripheral surface of the preform layer beneath the projecting portion of the working layer; and successively acid etching away the working and preform layers to expose the remainder portion of the first electrode layer.

2. The method of claim 1 wherein the base layer is provided with a nonconductive protective base layer having a level differential portion, covered by a conductive base layer; and the step of direct dry etching the first electrode layer also cleanly removes the conductive base layer from the level differential portion of the nonconductive protective layer without leaving a residue.

3. The method of claim 1, further comprising the steps of:

after CVD depositing and heating the first electrode layer, depositing a protective layer of $SiO_2$ over the electrode layer;

etching the entire surface of the protective layer so that a remainder portion of the protective layer remains indented on a peripheral surface of the first electrode layer which is beneath the projecting portion of the working layer; and during the step of successively acid etching away the working and preform layers, also etching away the remainder portion of the protective layer.

4. The method of claim 1 further comprising the steps of:

after successively acid etching away the working and preform layers, forming a dielectric layer over the remainder portion of the first electrode layer; and depositing a second electrode layer of conducting material on the dielectric layer; whereby the first electrode, dielectric layer, and second electrode form a capacitor.

* * * * *